(12) United States Patent
Kim et al.

(10) Patent No.: US 12,284,883 B2
(45) Date of Patent: *Apr. 22, 2025

(54) DISPLAY APPARATUS

(71) Applicant: SAMSUNG DISPLAY CO., LTD., Yongin-si (KR)

(72) Inventors: Eunhyun Kim, Yongin-si (KR); Eunhye Ko, Yongin-si (KR); Yeonhong Kim, Yongin-si (KR); Kyoungwon Lee, Yongin-si (KR); Sunhee Lee, Yongin-si (KR); Junhyung Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/460,345

(22) Filed: Sep. 1, 2023

(65) Prior Publication Data

US 2023/0413620 A1      Dec. 21, 2023

Related U.S. Application Data

(63) Continuation of application No. 17/332,698, filed on May 27, 2021, now Pat. No. 11,751,441.

(30) Foreign Application Priority Data

Nov. 5, 2020    (KR) .................. 10-2020-0147079

(51) Int. Cl.
*H10K 59/126*    (2023.01)
*H10K 59/131*    (2023.01)
(Continued)

(52) U.S. Cl.
CPC ......... *H10K 59/126* (2023.02); *H10K 59/131* (2023.02); *H10K 77/111* (2023.02); *H10K 2102/311* (2023.02)

(58) Field of Classification Search
CPC .. H10K 59/126; H10K 59/131; H10K 77/111; H10K 2102/311; H10K 59/123;
(Continued)

(56) References Cited

U.S. PATENT DOCUMENTS 6,750,476 B2    6/2004    Katayama
10,049,635 B2   8/2018    Kawamura et al.
(Continued)

FOREIGN PATENT DOCUMENTS

KR    10-2015-0078593 A    7/2015
KR       10-1901251 B1     9/2018
KR    10-2019-0083392 A    7/2019

*Primary Examiner* — J. E. Schoenholtz
(74) *Attorney, Agent, or Firm* — Womble Bond Dickinson (US) LLP

(57) ABSTRACT

A display apparatus in which an area of a peripheral area may be reduced while having a simple structure, the display apparatus includes a substrate, a bottom metal layer on the substrate and including a first extension line extending from the peripheral area outside a display area into the display area, a semiconductor layer on the bottom metal layer, a gate layer on the semiconductor layer, a first metal layer on the gate layer, and a second metal layer on the first metal layer and including a first data line extending from the peripheral area into the display area and electrically coupled to the first extension line in the peripheral area.

19 Claims, 14 Drawing Sheets

(51) Int. Cl.
*H10K 77/10* (2023.01)
*H10K 102/00* (2023.01)

(58) Field of Classification Search
CPC .. H10K 59/12; H10K 59/1213; H10K 59/124; H10K 50/00; H01L 27/1225; H01L 27/124
See application file for complete search history.

(56) References Cited

U.S. PATENT DOCUMENTS

| | | | |
|---|---|---|---|
| 11,751,441 B2* | 9/2023 | Kim | H10K 59/131 257/43 |
| 2002/0145140 A1 | 10/2002 | Katayama | |
| 2002/0154076 A1 | 10/2002 | Greene et al. | |
| 2020/0343331 A1 | 10/2020 | Jeong et al. | |

* cited by examiner

DISPLAY APPARATUS

CROSS-REFERENCE TO RELATED APPLICATIONS

This application is a continuation of U.S. patent application Ser. No. 17/332,698, filed May 27, 2021, which claims priority to and the benefit of Korean Patent Application No. 10-2020-0147079, filed Nov. 5, 2020, the entire content of both of which is incorporated herein by reference.

BACKGROUND

1. Field

One or more embodiments of the present disclosure relate to a display apparatus, and, for example, to a display apparatus in which the area of a peripheral area may be reduced while having a simple structure.

2. Description of the Related Art

Generally, a display apparatus includes a plurality of pixels, and each of the plurality of pixels includes a display element and a pixel circuit configured to control the display element. A pixel circuit includes a thin-film transistor (TFT), a capacitor, lines, and/or the like.

Such a pixel circuit controls the brightness and/or the like of a pixel according to a transmitted data signal or the like. A data signal is transmitted, through a data line, to a pixel from a driving unit located in a peripheral area around (e.g., outside) a display area.

SUMMARY

In a display apparatus in the related art, an area in which a driving unit or the like is located is wide, or the area of a portion from a driving unit to a display area is wide. As a result, the area of a dead space, in which a display element is not arranged, is excessively wide.

Aspects of one or more embodiments of the present disclosure are directed toward a display apparatus, in which the area of a peripheral area may be reduced while having a simple structure. However, these aspects are examples, and the scope of the present disclosure is not limited thereto.

Additional aspects will be set forth in part in the description which follows and, in part, will be apparent from the description, or may be learned by practice of the presented embodiments of the disclosure.

According to one or more embodiments of the present disclosure, provided is a display apparatus including a substrate, a bottom metal layer on the substrate and including a first extension line extending from a peripheral area outside a display area into the display area, a semiconductor layer on the bottom metal layer, a gate layer on the semiconductor layer, a first metal layer on the gate layer, and a second metal layer on the first metal layer, and including a first data line, the first data line extending from the peripheral area into the display area and being electrically coupled to the first extension line in the peripheral area.

The first metal layer may include a second extension line in the display area, the second extension line being electrically coupled to the first extension line, and extending in a direction crossing an extension direction of the first extension line.

The bottom metal layer may further include a third extension line extending from the display area to the peripheral area and electrically coupled to the second extension line.

The third extension line may extend in an extension direction parallel to the extension direction of the first extension line.

The display apparatus may further include a first input line on the third extension line in the peripheral area, the first input line being electrically coupled to the third extension line.

The display apparatus may further include a second input line below the second metal layer in the peripheral area, wherein the second metal layer may further include a second data line extending from the peripheral area into the display area and electrically coupled to the second input line in the peripheral area.

The first input line and the second input line may be on a same layer as the gate layer.

The first input line and the second input line may be on a same layer as the first metal layer.

The bottom metal layer may overlap the semiconductor layer in a plan view (e.g., when viewed from a direction normal or perpendicular to an upper surface of the substrate).

The semiconductor layer may include an oxide semiconductor material.

The gate layer may include a first outer connection layer in the peripheral area, the first outer connection layer may be electrically coupled to the first extension line, the first metal layer may include a second outer connection layer in the peripheral area, the second outer connection layer may be electrically coupled to the first outer connection layer, and the first data line may be electrically coupled to the second outer connection layer in the peripheral area.

The semiconductor layer may include a switching semiconductor layer for a switching transistor in the display area, the first metal layer may further include a first transfer layer in the display area, and the first data line may be electrically coupled to the switching semiconductor layer through the first transfer layer.

The gate layer may further include a switching gate electrode on the switching semiconductor layer.

The display apparatus may further include an insulating layer between corresponding two layers selected from the bottom metal layer, the semiconductor layer, the gate layer, the first metal layer, and the second metal layer.

The display apparatus may further include a pixel electrode on the second metal layer, an intermediate layer on the pixel electrode and including an emission layer, and an opposite electrode on the intermediate layer.

The bottom metal layer may further include a second extension line in the display area, the second extension line being connected to the first extension line, and extends in a direction crossing an extension direction of the first extension line.

The bottom metal layer may further include a third extension line, the third extension line extending from the display area to the peripheral area and electrically coupled to the second extension line.

The third extension line may extend in an extension direction parallel to the extension direction of the first extension line.

The display apparatus may further include a first input line on the third extension line in the peripheral area, the first input line being electrically coupled to the third extension line.

Other aspects, features, and advantages other than those described above should become apparent from the following drawings, claims, and the detailed description of the disclosure.

BRIEF DESCRIPTION OF THE DRAWINGS

The above and other aspects, features, and advantages of certain embodiments of the disclosure should be more apparent from the following description taken in conjunction with the accompanying drawings, in which.

DETAILED DESCRIPTION

Figure 1:
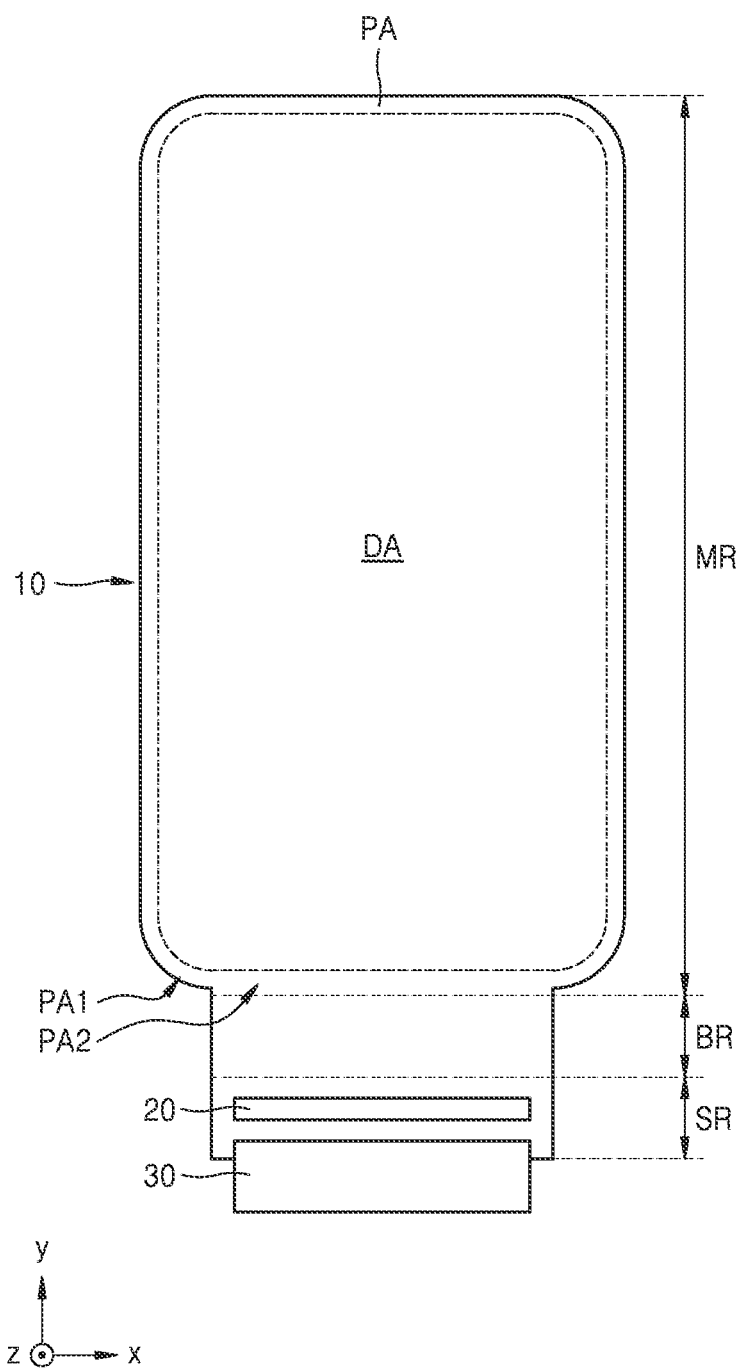
FIG. 1 is a schematic plan view (e.g., when viewed from a direction normal or perpendicular to an upper surface of the substrate) of a portion of a display apparatus according to embodiments of the present disclosure.

Reference will now be made in detail to embodiments of the present disclosure, examples of which are illustrated in the accompanying drawings, wherein like reference numerals refer to like elements throughout. In this regard, the present embodiments may have different forms and should not be construed as being limited to the descriptions set forth herein. Accordingly, the embodiments of the present disclosure are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. Effects and features of the present disclosure and methods of achieving the same will be apparent with reference to embodiments and drawings described below in detail. The present disclosure may, however, be embodied in many different forms and should not be construed as being limited to the embodiments of the present disclosure set forth herein.

The disclosure will now be described more fully with reference to the accompanying drawings, in which embodiments of the disclosure are shown. Like reference numerals in the drawings denote like elements, and thus their description will be omitted.

It will be understood that when a layer, region, or component is referred to as being "formed on" another layer, region, or component, it can be directly or indirectly formed on the other layer, region, or component, for example, intervening layers, regions, or components may be present. Sizes of components in the drawings may be exaggerated for convenience of explanation. For example, since sizes and thicknesses of components in the drawings are arbitrarily illustrated for convenience of explanation, the following embodiments are not limited thereto. It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present. Further, the use of "may" when describing embodiments of the present invention refers to "one or more embodiments of the present invention."

The x, y, and z rows are not limited to three rows on the orthogonal coordinates system, and may be interpreted in a broad sense including the same. For example, the x-axis, the y-axis, and the z-axis may be perpendicular to one another, or may represent different directions that are not perpendicular to one another.

Figure 2:
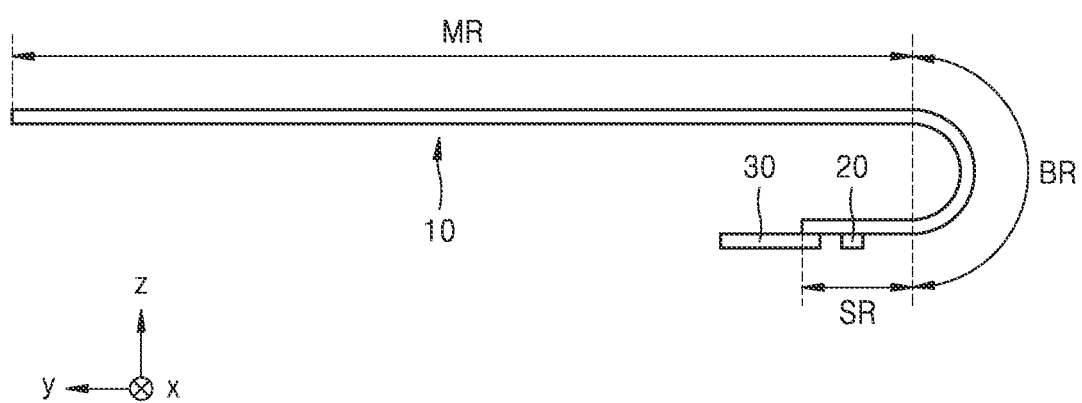
FIG. 2 is a schematic side view of the display apparatus of FIG. 1.

FIG. 1 is a schematic plan view (e.g., when viewed from a direction normal or perpendicular to an upper surface of the substrate) of a portion of a display apparatus according to embodiments of the present disclosure, and FIG. 2 is a schematic side view of the display apparatus of FIG. 1.

Referring to FIGS. 1 and 2, the display apparatus according to the present embodiment includes a display panel 10. Any display apparatus is possible as long as including the display panel 10. For example, the display apparatus may be various apparatuses such as a smart phone, a tablet, a laptop, a television, a billboard, or the like.

The display panel 10 includes a display area DA and a peripheral area PA outside the display area DA. The display area DA is a portion that displays an image, and a plurality of pixels may be in the display area DA. The display area DA may have various shapes, for example, a circular shape, an oval shape, a polygonal shape, a shape of a particular figure, and/or the like. For example, the display area DA may have a substantially rectangular shape with rounded corners.

The peripheral area PA may be located outside the display area DA. The peripheral area PA may include a first peripheral area PA1 arranged to substantially surround the display area DA and a second peripheral area PA2 located below the display area DA (the y-axis direction) and extending in a direction (the y-axis direction) away from the display area DA. A width of the second peripheral area PA2 in a direction (the x-axis direction) crossing the direction (the y-axis direction) in which the second peripheral area PA2 extends may be less than a width of the display area DA. Through this structure, at least a portion of the second peripheral area PA2 may be bendable, and, for example, may be easily bent.

Because the display panel 10 includes a substrate 100 (FIG. 3), the substrate 100 may include the display area DA and the peripheral area PA. Hereinafter, for convenience, the substrate 100 may be described as including the display area DA and the peripheral area PA.

The display panel 10 may also include a main area MR, a bending area BR outside the main area MR, and a sub-area SR located on the opposite side of the main area MR around the bending area BR. As illustrated in FIG. 2 with respect to one or more embodiments, in the bending area BR, the display panel 10 may be bent, and a portion of the sub-area SR may overlap the main area MR when viewed from a z-axis direction. The present disclosure is not limited to a bent display apparatus, and may also applied to a display apparatus that is not bent. The sub-area SR may be a non-display area, as will be described below. The display panel 10 is bent in the bending area BR, so that a non-display area may not be viewed or the visible area thereof may be minimized when viewing the display apparatus in a direction (a z-axis direction) perpendicular to the main area MR.

A data pad unit 20 may be in the sub-area SR of the display panel 10. The data pad unit 20 may be electrically coupled to an integrated circuit (for example, a driving chip) that drives the display panel 10. The integrated circuit may be a data driving integrated circuit that generates data signals, but the present disclosure is not limited thereto. In addition, when necessary, the integrated circuit may be directly formed in the sub-area SR of the display panel 10.

Although the data pad unit 20 is formed on the same surface as a display surface of the display area DA, the data pad unit 20 may be on a rear surface of the main area MR as the display panel 10 is bent in the bending area BR. The data pad unit 20 may include a plurality of pads.

A printed circuit board 30 or the like may be attached to an end portion of the sub-area SR of the display panel 10. The printed circuit board 30 may be electrically coupled to the data pad unit 20 and/or the like through the plurality of pads.

Hereinafter, the display apparatus according to embodiments of the present disclosure may be described as an organic light-emitting display apparatus. However, the display apparatus of the present disclosure is not limited thereto. For example, the display apparatus of the present disclosure may be an inorganic light-emitting display apparatus (inorganic light-emitting display or inorganic EL display apparatus) or a display apparatus such as a quantum dot light-emitting display apparatus. For example, an emission layer included in a display element provided in the display apparatus may include an organic material or an inorganic material. In addition, quantum dots may be on a path of light emitted from the emission layer.

Figure 3:
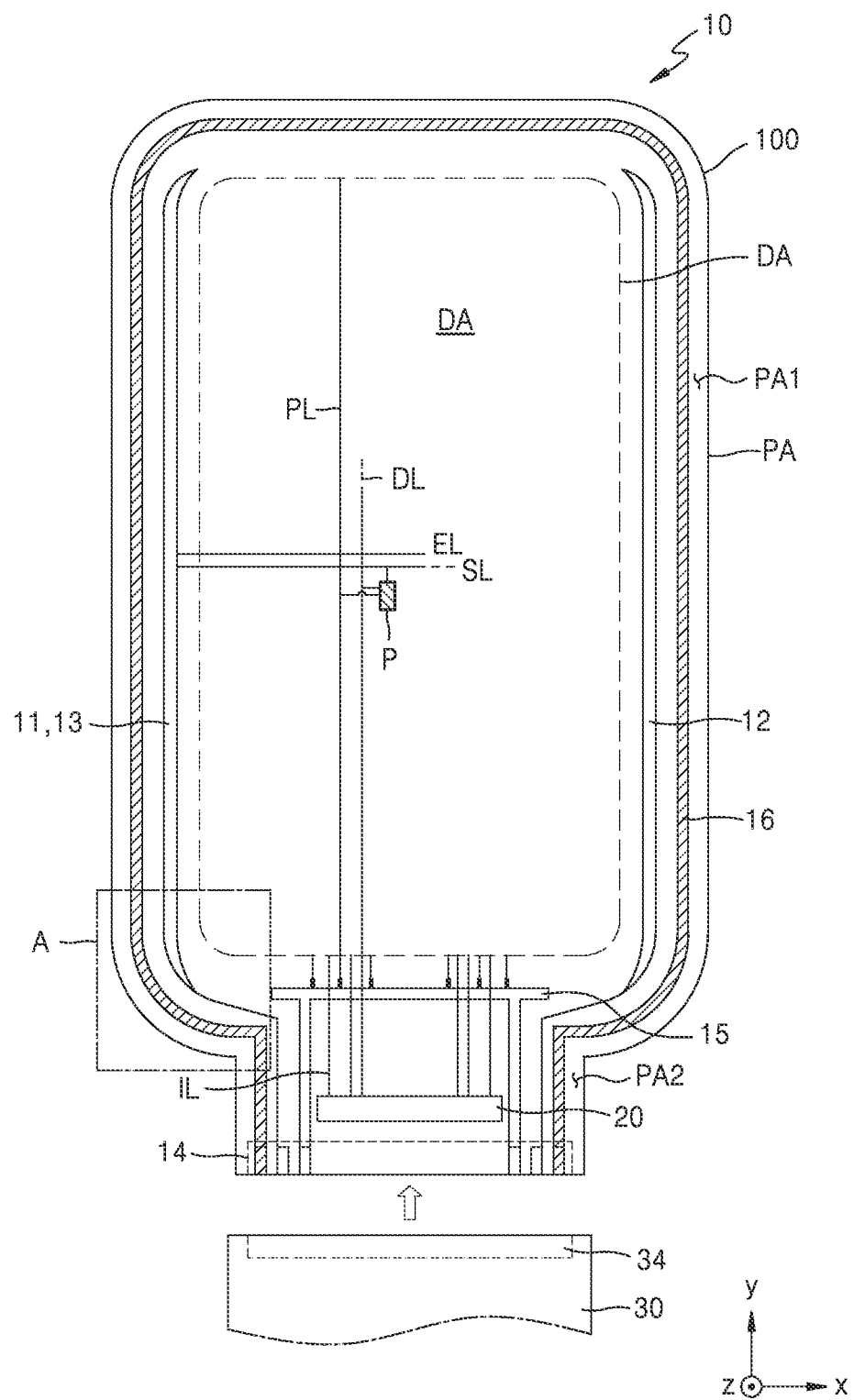
FIG. 3 is a schematic plan view of a portion of a display apparatus according to embodiments of the present disclosure.

FIG. 3 is a schematic plan view (e.g., when viewed from a direction normal or perpendicular to an upper surface of the substrate) of the display panel 10 included in a display apparatus according to embodiments of the present disclosure. The display panel 10 may include the substrate 100. Various components included in the display panel 10 may be on the substrate 100. The substrate 100 may include glass, a metal, a polymer resin, and/or the like. As described above, when the display panel 10 is bent in the bending area BR, the substrate 100 may be flexible or bendable. In this case, the substrate 100 may include a polymer resin such as polyethersulphone, polyacrylate, polyetherimide, polyethylene naphthalate, polyethylene terephthalate, polyphenylene sulfide, polyarylate, polyimide, polycarbonate, and/or cellulose acetate propionate. The substrate 100 may have a multi-layered structure including two layers each including the polymer resin and a barrier layer including an inorganic material (for example, silicon oxide, silicon nitride, silicon oxynitride, or the like) between the two layers, and various modifications may also be made.

A plurality of pixels P may be in the display area DA. Each of the plurality of pixels P refers to a sub-pixel, and may include a display element such as an organic light-emitting diode (OLED). The pixel P may emit a suitable color of light, for example, red, green, blue, or white light.

The pixel P may be electrically coupled to outer circuits in the peripheral area PA. A first scan driving circuit 11, a second scan driving circuit 12, an emission control driving circuit 13, a terminal 14, a first power supply line 15, and a second power supply line 16 may be in the peripheral area PA.

The first scan driving circuit 11 may provide a scan signal to the pixel P through a scan line SL. The second scan driving circuit 12 may be in parallel with the first scan driving circuit 11 with the display area DA therebetween. Some of the pixels P in the display area DA may be electrically coupled to the first scan driving circuit 11, and the remaining pixels P may be electrically coupled to the second scan driving circuit 12. When necessary, the second scan driving circuit 12 may be omitted, and all of the pixels P in the display area DA may be electrically coupled to the first scan driving circuit 11.

The emission control driving circuit 13 may be on the side of the first scan driving circuit 11 and may provide an emission control signal to the pixel P through an emission control line EL. Although FIG. 3 illustrates that the emission control driving circuit 13 is on one side of the display area DA, the emission control driving circuit 13 may be on either side or both sides of the display area DA, similar to the first scan driving circuit 11 and the second scan driving circuit 12.

The terminal 14 may be in the second peripheral area PA2 of the substrate 100. The terminal 14 may not be covered by an insulating layer but exposed to be electrically coupled to the printed circuit board 30. A terminal 34 of the printed circuit board 30 may be electrically coupled to the terminal 14 of the display panel 10.

The printed circuit board 30 transmits a signal or power of a controller to the display panel 10. A control signal generated by the controller may be transmitted to each of the driving circuits 11, 12, and 13 through the printed circuit board 30. In addition, the controller may transmit a first power voltage ELVDD (FIG. 6) to the first power supply line 15 and provide a second power voltage ELVSS (FIG. 6) to the second power supply line 16. The first power voltage ELVDD may be transmitted to each pixel P through a driving voltage line PL connected to the first power supply line and the second power voltage ELVSS may be transmitted to an opposite electrode of the pixel P connected to the second power supply line 16. The first power supply line may have a shape extending in one direction (for example, an x-axis direction). The second power supply line 16 may have a shape partially surrounding the display area DA.

The controller may generate a data signal, and the generated data signal may be transmitted to an input line IL through the data pad unit 20 and to the pixel P through a data line DL coupled to the input line IL.

Figure 4:
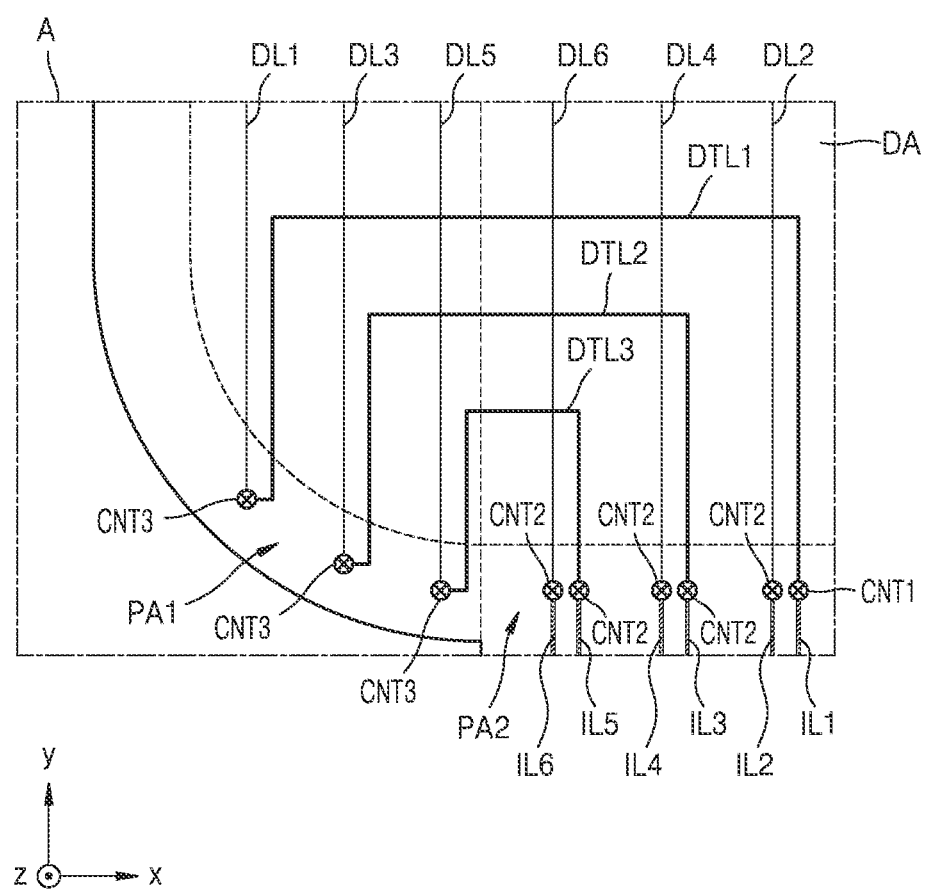
FIGS. 4 and 5 are schematic enlarged plan views of portion A of FIG. 3.
Figure 5:
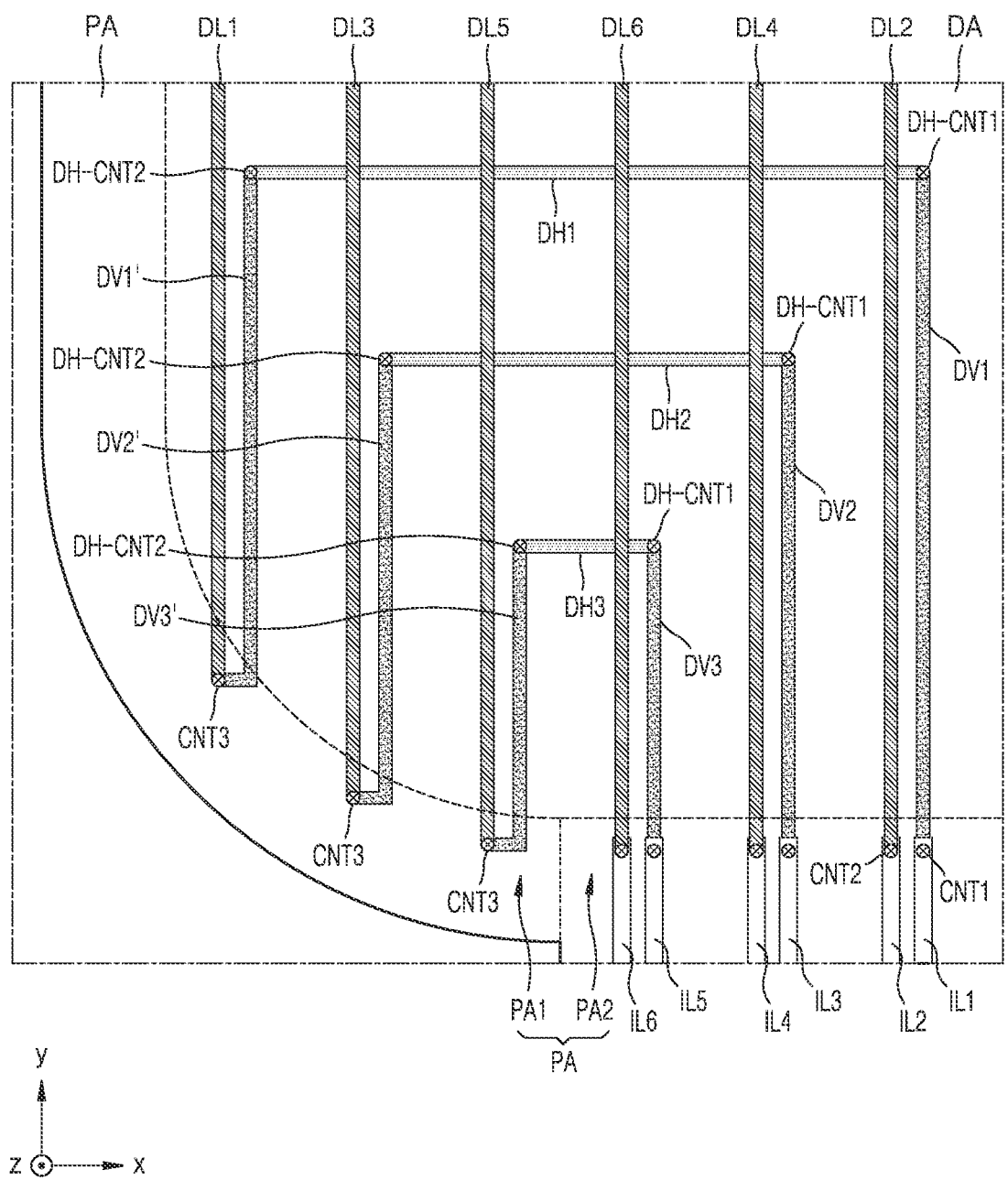

FIGS. 4 and 5 show schematic enlarged plan views of a portion A of FIG. 3.

Various suitable signals may be applied to the display area DA. For example, a data signal configured to adjust the brightness of each pixel P may be applied to the display area DA. To this end, data lines DL1 to DL6 (e.g. DL1, DL2, DL3, DL4, DL5, and DL6) in a first direction (an x-axis direction) to be substantially parallel to each other and extending in a second direction (a y-axis direction) crossing the first direction may extend from the peripheral area PA into the display area DA, as described with reference to FIG. 4. Other than the data lines DL1 to DL6, various lines such as power lines, scan lines, and/or the like, may be located inside and outside the display area DA.

First to sixth input lines IL1 to IL6 (e.g. IL1, IL2, IL3, IL4, IL5, and IL6) may be located in the peripheral area PA, and, for example, in the second peripheral area PA2. The first to sixth input lines IL1 to IL6 may be coupled to the data pad unit 20 to receive data signals. Each of the first to sixth data lines DL1 to DL6 (e.g. DL1, DL2, DL3, DL4, DL5, and DL6) may be electrically coupled to a corresponding one of the first to sixth input lines IL1 to IL6, to transmit a data signal to the pixels P in the display area DA.

For convenience of description, six input lines and six data lines are shown in FIGS. 4 and 5. However, the present disclosure is not limited thereto, and the number of input lines and the number of data lines may be greater than or equal to 6.

The first to sixth input lines IL1 to IL6 may be sequentially arranged from the center of the second peripheral area PA2 in an edge direction (x-axis direction) of the second peripheral area PA2. In an embodiment, the second input line IL2, the fourth input line IL4, and the sixth input line IL6, may be at even-numbered locations, and may be electrically coupled to the second data line DL2, the fourth data line DL4, and the sixth data line DL6, which may be continuously arranged adjacent with each other. The second input line IL2, the fourth input line IL4, and the sixth input line IL6 may be integrally formed with the second data line DL2, the fourth data line DL4, and the sixth data line DL6, or may be electrically coupled to the second data line DL2, the fourth data line DL4, and the sixth data line DL6 through a second contact hole CNT2, as described with reference to FIGS. 4 and 5. In another embodiment, as described with reference to FIG. 5, the second input line IL2, the fourth input line IL4, and the sixth input line IL6 may be below the second data line DL2, the fourth data line DL4, and the sixth data line DL6. Each of the second data line DL2, the fourth data line DL4, and the sixth data line DL6 may receive a data signal from a corresponding one of the second input line IL2, the fourth input line IL4, and the sixth input line IL6.

The first input line IL1, the third input line IL3, and the fifth input line IL5, may be positioned at odd-numbered locations, and may be electrically coupled to the first data line DL1, the third data line DL3, and the fifth data line DL5, which may be continuously arranged adjacent with each other, through first to third data transmission lines DTL1 to DTL3. That is, the first data line DL1, the third data line DL3, and the fifth data line DL5 may respectively receive a data signal from the first input line IL1, the third input line IL3, and the fifth input line IL5 through the first data transmission line DTL1, the second data transmission line DTL2, and the third data transmission line DTL3.

The first data transmission line DTL1 to the third data transmission line DTL3 may be arranged to pass through a portion of the display area DA adjacent to the peripheral area PA, that is, to pass through the display area DA. The first input line IL1 may be electrically coupled to the first data line DL1 through the first data transmission line DTL1, the third input line IL3 may be electrically coupled to the third data line DL3 through the second data transmission line DTL2, and the fifth input line IL5 may be electrically coupled to the fifth data line DL5 through the third data transmission line DTL3.

An end of each of the first data transmission line DTL1, the second data transmission line DTL2, and the third data transmission line DTL3 may be electrically coupled to a corresponding one of the first input line IL1, the third input line IL3, and the fifth input line IL5 through a first contact hole CNT1. Another end of each of the first data transmission line DTL1, the second data transmission line DTL2, and the third data transmission line DTL3 may be electrically coupled to a corresponding one of the first data line DL1, the third data line DL3, and the fifth data line DL5 through a third contact hole CNT3. Although the first contact hole CNT1 and the third contact hole CNT3 are illustrated as being located in the peripheral area PA in FIGS. 4 and 5, the present disclosure is not limited thereto. For example, the first contact hole CNT1 and/or the third contact hole CNT3 may be located in the display area DA, or elsewhere.

Through this structure, the first input line IL1 may transmit a data signal to the first data line DL1, the third input line IL3 may transmit a data signal to the third data line DL3, and the fifth input line IL5 may transmit a data signal to the fifth data line DL5.

FIG. 5 illustrates in detail an exemplary configuration of the first data transmission line DTL1, the second data transmission line DTL2 and the third data transmission line DTL3.

As described with reference to FIG. 5, each of the first input line IL1, the third input line IL3, and the fifth input line IL5 may be electrically coupled to a corresponding one of the first data line DL1, the third data line DL3, and the fifth data line DL5 through a corresponding one of the first data transmission line DTL1, the second data transmission line DTL2, and the third data transmission line DTL3. Here, the first data transmission line DTL1 may include a first extension line DV1', a second extension line DH1, and a third extension line DV1. Similarly, the second data transmission line DTL2 may include a first extension line DV2', a second extension line DH2, and a third extension line DV2, and the third data transmission line DTL3 may include a first extension line DV3', a second extension line DH3, and a third extension line DV3. The first extension lines DV1', DV2', and DV3' and the third extension lines DV1, DV2, and DV3 may be arranged substantially parallel to the first data line DL1 to sixth data line DL6. The second extension lines DH1, DH2, and DH3 may have a shape extending in a first direction (the x-axis direction) crossing the second direction (the y-axis direction) in which the first data line DL1 to the sixth data line DL6 extend.

Each of the first input line IL1, the third input line IL3, and the fifth input line IL5 may be electrically coupled to a corresponding one of the third extension lines DV1, DV2, and DV3 through the first contact hole CNT1, and each of the first data line DL1, the third data line DL3, and the fifth data line DL5 may be electrically coupled to a corresponding one of the first extension lines DV1', DV2', and DV3' through the third contact hole CNT3. Each of the second extension lines DH1, DH2, and DH3 may be, through a first connection contact portion DH-CNT1 located at one end thereof, electrically coupled to a corresponding one of the third extension lines DV1, DV2, and DV3. Each of the second extension lines DH1, DH2, and DH3 may be, through a second connection contact portion DH-CNT2 located at the other end thereof, electrically coupled to a corresponding one of the first extension lines DV1', DV2', and DV3'.

The first extension lines DV1', DV2', and DV3' and the third extension lines DV1, DV2, and DV3 may be on the same layer. In addition, the second extension lines DH1, DH2, and DH3 may be on a layer different from a layer on which the first extension lines DV1', DV2', and DV3' and the third extension lines DV1, DV2, and DV3 are arranged or disposed. FIG. 5 illustrates that the second extension lines DH1, DH2, and DH3 are above the first extension lines DV1', DV2', and DV3' and the third extension lines DV1, DV2, and DV3. However, the present disclosure is not limited thereto, and the first extension lines DV1', DV2', and DV3', the second extension lines DH1, DH2, and DH3, and the third extension lines DV1, DV2, and DV3 may be on the same layer, and all may be integrally formed as a single body.

For reference, certain components being on the same layer may refer to that the components are simultaneously formed through the same mask operation with the same material. In such embodiments, the components may include the same material.

In a plan view (e.g., when viewed from a direction normal or perpendicular to the substrate 100), the second extension lines DH1, DH2, and DH3 may cross the first data line DL1 to the sixth data line DL6. Accordingly, to prevent or protect the second extension lines DH1, DH2, and DH3 from contacting the first data line DL1 to the sixth data line DL6, the second extension lines DH1, DH2, and DH3 may be below the first data line DL1 to the sixth data line DL6.

Figure 6:
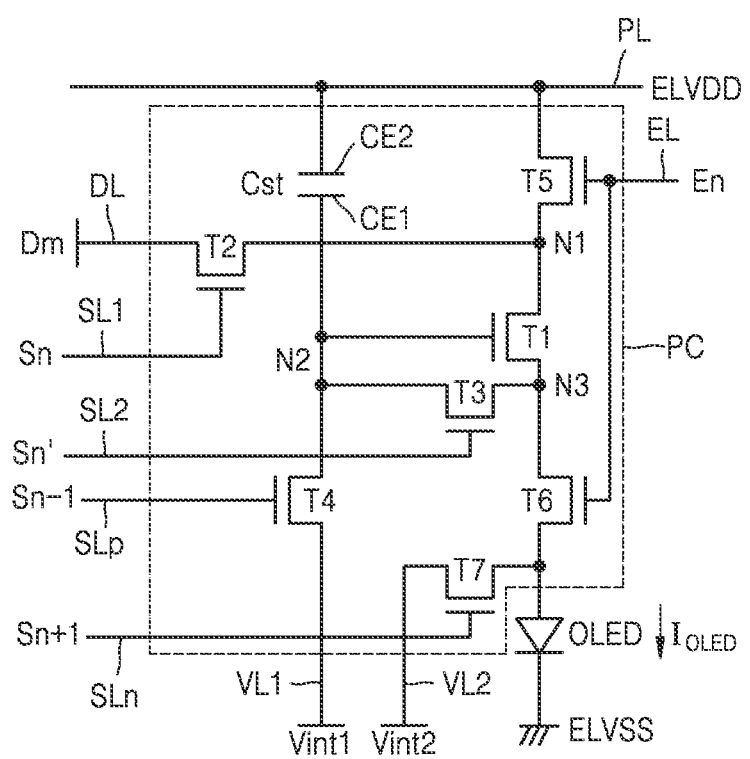
FIG. 6 is an equivalent circuit diagram of a pixel included in a display apparatus according to embodiments of the present disclosure.

FIG. 6 is an equivalent circuit diagram of a pixel included in a display apparatus according to embodiments of the present disclosure. As described with reference to FIG. 6, a pixel may include a pixel circuit PC and an organic light-emitting diode OLED electrically coupled to the pixel circuit PC.

The pixel circuit PC may include a plurality of thin-film transistors T1 to T7 (e.g. T1, T2, T3, T4, T5, T6, and T7) and a storage capacitor Cst. The plurality of thin-film transistors T1 to T7 and the storage capacitor Cst may be connected to signal lines SL1, SL2, SLp, SLn, EL, DL, a first initialization voltage line VL1, a second initialization voltage line VL2, and the driving voltage line PL. At least one of the lines, for example, the driving voltage line PL may be shared by neighboring pixels P.

The plurality of thin-film transistors T1 to T7 may include a driving transistor T1, a switching transistor T2, a compensation transistor T3, a first initialization transistor T4, an operation control transistor T5, an emission control transistor T6, and a second initialization transistor T7.

The organic light-emitting diode OLED may include a first electrode (for example, a pixel electrode) and a second electrode (for example, a common electrode). The first electrode of the organic light-emitting diode OLED may be connected to the driving transistor T1 via the emission control transistor T6 to receive a driving current $I_{OLED}$, and the second electrode may receive the second power voltage ELVSS. The organic light-emitting diode OLED may emit light having a brightness corresponding to the driving current $I_{OLED}$.

The plurality of thin-film transistors T1 to T7 may include a semiconductor layer, and the semiconductor layer may include an oxide semiconductor material. Accordingly, the plurality of thin-film transistors T1 to T7 may be n-channel metal oxide semiconductor field effect transistors (NMOS-FET).

The signal lines may include a first scan line SL1 configured to deliver a first scan signal Sn, a second scan line SL2 configured to deliver a second scan signal Sn', a previous scan line SLp configured to deliver a previous scan signal Sn−1 to the first initialization transistor T4, a following scan line SLn configured to deliver a following scan signal Sn+1 to the second initialization transistor T7, an emission control line EL configured to deliver an emission control signal En to the operation control transistor T5 and the emission control transistor T6, and a data line DL crossing the first scan line SL1 and configured to deliver a data signal Dm.

The driving voltage line PL may be configured to deliver the first power voltage ELVDD to the driving transistor T1, the first initialization voltage line VL1 may be configured to deliver a first initialization voltage Vint1 initializing the driving transistor T1, and the second initialization voltage line VL2 may be configured to deliver a second initialization voltage Vint2 initializing the first electrode of the organic light-emitting diode OLED.

A driving gate electrode of the driving transistor T1 may be connected to the storage capacitor Cst through a second node N2, any one of a source area and a drain area of the driving transistor T1 may be connected to the driving voltage line PL via the operation control transistor T5 through a first node N1, and the other one of the source area and the drain area of the driving transistor T1 may be electrically coupled to the pixel electrode of the organic light-emitting diode OLED via the emission control transistor T6 through a third node N3. The driving transistor T1 may receive the data signal Dm according to a switching operation of the switching transistor T2 and supply a driving current $I_{OLED}$ to the organic light-emitting diode OLED.

A switching gate electrode of the switching transistor T2 may be connected to the first scan line SL1 configured to deliver the first scan signal Sn, any one of a source area and a drain area of the switching transistor T2 may be connected to the data line DL, and the other one of the source area and the drain area of the switching transistor T2 may be connected to the driving voltage line PL via the operation control transistor T5 while being connected to the driving transistor T1 through the first node N1. The switching transistor T2 may be turned on according to the first scan signal Sn received through the first scan line SL1 and may perform a switching operation of delivering the data signal Dm delivered to the data line DL to the driving transistor T1 through the first node N1.

A compensation gate electrode of the compensation transistor T3 may be connected to the second scan line SL2. Any one of a source area and a drain area of the compensation transistor T3 may be connected to the first electrode of the organic light-emitting diode OLED via the emission control transistor T6 through the third node N3. The other one of the source area and the drain area of the compensation transistor T3 may be connected to a first capacitor electrode CE1 of the storage capacitor Cst and the driving gate electrode of the driving transistor T1 through the second node N2. The compensation transistor T3 may be turned on according to the second scan signal Sn' received through the second scan line SL2 to diode-connect the driving transistor T1.

A first initialization gate electrode of the first initialization transistor T4 may be connected to the previous scan line SLp. Any one of a source area and a drain area of the first initialization transistor T4 may be connected to the first initialization voltage line VL1. The other one of the source area and the drain area of the first initialization transistor T4 may be connected to the first capacitor electrode CE1 of the storage capacitor Cst, the driving gate electrode of the driving transistor T1, or the like through the second node N2. The first initialization transistor T4 may be turned on according to the previous scan signal Sn−1 received through the previous scan line SLp and configured to deliver the first initialization voltage Vint1 to the driving gate electrode of the driving transistor T1 to perform an initialization operation of initializing a voltage of the driving gate electrode of the driving transistor T1.

An operation control gate electrode of the operation control transistor T5 may be connected to the emission control line EL. Any one of a source area and a drain area of the operation control transistor T5 may be connected to the driving voltage line PL, and the other one of the source area and the drain area of the operation control transistor T5 may be connected to the driving transistor T1 and the switching transistor T2 through the first node N1.

An emission control gate electrode of the emission control transistor T6 may be connected to the emission control line EL. Any one of a source area and a drain area of the emission control transistor T6 may be connected to the driving transistor T1 and the compensation transistor T3 through the third node N3, and the other one of the source area and the drain area of the emission control transistor T6 may be electrically coupled to the first electrode of the organic light-emitting diode OLED.

The operation control transistor T5 and the emission control transistor T6 may be turned on at the same time according to the emission control signal En received through the emission control line EL, and the first power voltage ELVDD may be delivered to the organic light-emitting diode OLED to allow a driving current $I_{OLED}$ flows through the organic light-emitting diode OLED.

A second initialization gate electrode of the second initialization transistor T7 may be connected to the following scan line SLn. Any one of a source area and a drain area of the second initialization transistor T7 may be connected to the first electrode of the organic light-emitting diode OLED, and the other one of the source area and the drain area of the second initialization transistor T7 may be connected to the second initialization voltage line VL2 to receive the second initialization voltage Vint2. The second initialization transistor T7 may be turned on according to the following scan signal Sn+1 received through the following scan line SLn and initialize the first electrode of the organic light-emitting diode OLED. The following scan line SLn may be the same as the first scan line SL1. In this case, a corresponding scan line may function as the first scan line SL1 and the following scan line SLn by delivering the same electrical signal with a time difference.

The second initialization transistor T7 may be connected to the first scan line SL1. However, the present disclosure is not limited thereto, and the second initialization transistor T7 may be connected to the emission control line EL and may be driven according to the emission control signal En.

The storage capacitor Cst may include the first capacitor electrode CE1 and a second capacitor electrode CE2. The first capacitor electrode CE1 of the storage capacitor Cst is connected to the driving gate electrode of the driving transistor T1 through the second node N2, and the second capacitor electrode CE2 of the storage capacitor Cst is connected to the driving voltage line PL. The storage capacitor Cst may store a charge corresponding to a difference between a voltage of the driving gate electrode of the driving transistor T1 and the first power voltage ELVDD.

Detailed operations of each pixel P according to embodiments of the present disclosure are further described below.

During an initialization period, when the previous scan signal Sn−1 is supplied through the previous scan line SLp, the first initialization transistor T4 is turned on in response to the previous scan signal Sn−1, and the driving transistor T1 is initialized by the first initialization voltage Vint1 supplied from the first initialization voltage line VL1.

During a data programming period, when the first scan signal Sn and the second scan signal Sn' are respectively supplied through the first scan line SL1 and the second scan line SL2, the switching transistor T2 and the compensation transistor T3 may be turned on in response to the first scan signal Sn and the second scan signal Sn'. Then the driving transistor T1 may be diode-connected by the compensation transistor T3, which may be turned on and may be biased in a forward direction. Then, a compensation voltage Dm+Vth (Vth is a negative (−) value) obtained by reducing a threshold voltage from the data signal Dm supplied from the data line DL may be applied to a driving gate electrode of the driving transistor T1. The first power voltage ELVDD and the compensation voltage Dm+Vth may be applied to both ends of the storage capacitor Cst, and a charge corresponding to a voltage difference between the both ends may be stored in the storage capacitor Cst.

During an emission period, the operation control transistor T5 and the emission control transistor T6 may be turned on by the emission control signal En supplied from the emission control line EL. The driving current $I_{OLED}$ may be generated according to a voltage difference between a voltage of the driving gate electrode of the driving transistor T1 and the first power voltage ELVDD, and the driving current $I_{OLED}$ may be supplied to the organic light-emitting diode OLED through the emission control transistor T6.

In one or more embodiments, the plurality of thin-film transistors T1 to T7 may have a semiconductor layer including an oxide semiconductor material. Because an oxide semiconductor has high carrier mobility and low leakage current, a voltage drop may not large even when a driving time is long. That is, because color change of an image according to a voltage drop may not be not large even during low-frequency driving, the low-frequency driving is possible. In this way, because the oxide semiconductor has an advantage of having a small leakage current, a leakage current which may flow through a gate electrode of a thin-film transistor may be prevented, and power consumption may be reduced at the same time. On the other hand, the oxide semiconductor is sensitive to light, and variations in the amount of current or the like may occur due to external light. Accordingly, a bottom metal layer BML may absorb or reflect external light, so that external light incident to the oxide semiconductor may be prevented or minimized. To this end, the bottom metal layer BML (FIG. 8) may overlap a semiconductor layer 1100 (FIG. 9), when viewed from a direction perpendicular to an upper surface of the substrate 100.

Figure 7:
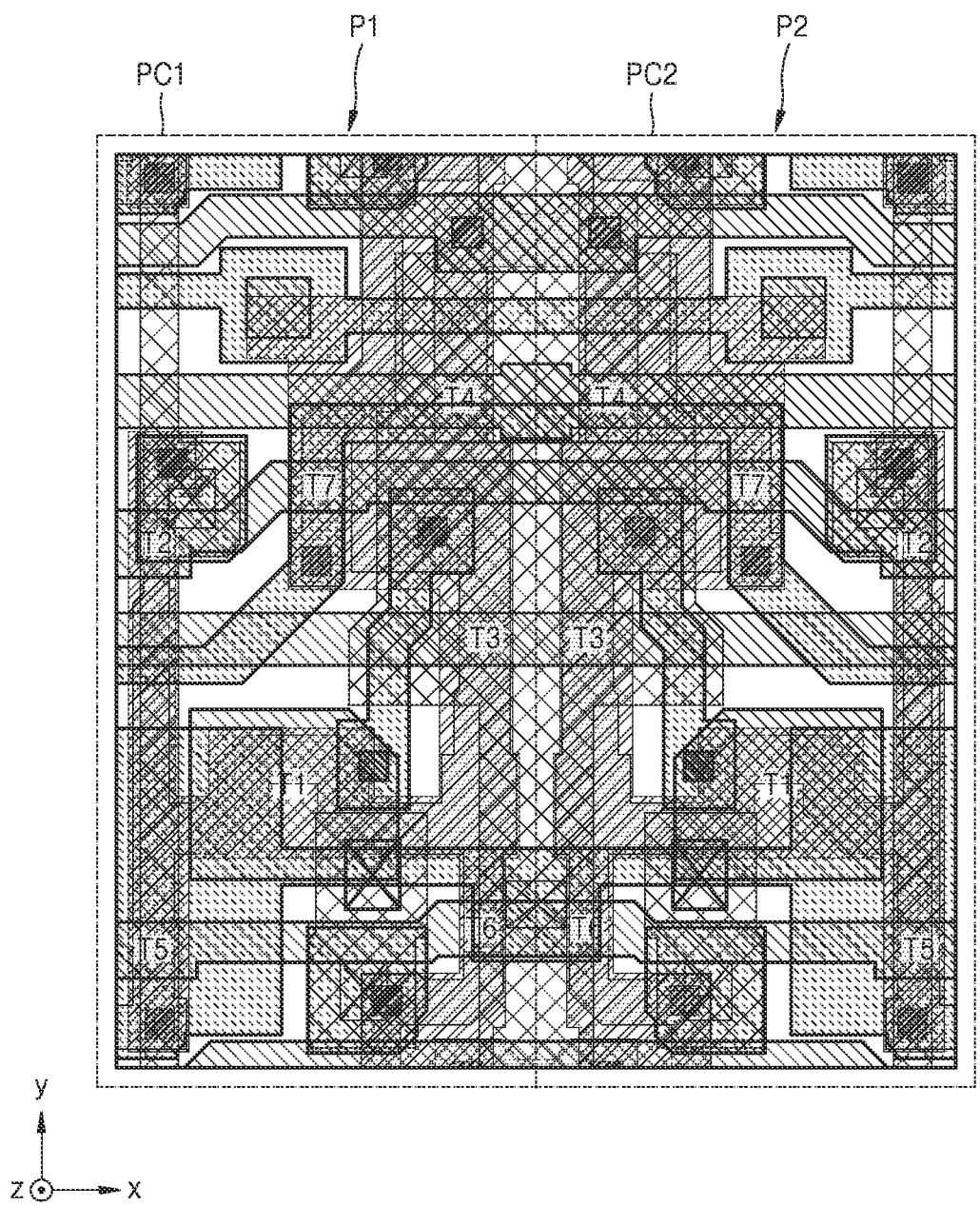
FIG. 7 is a schematic layout diagram illustrating positions of transistors, capacitors, or the like in a pixel included in a display apparatus according to embodiments of the present disclosure.
Figure 12:
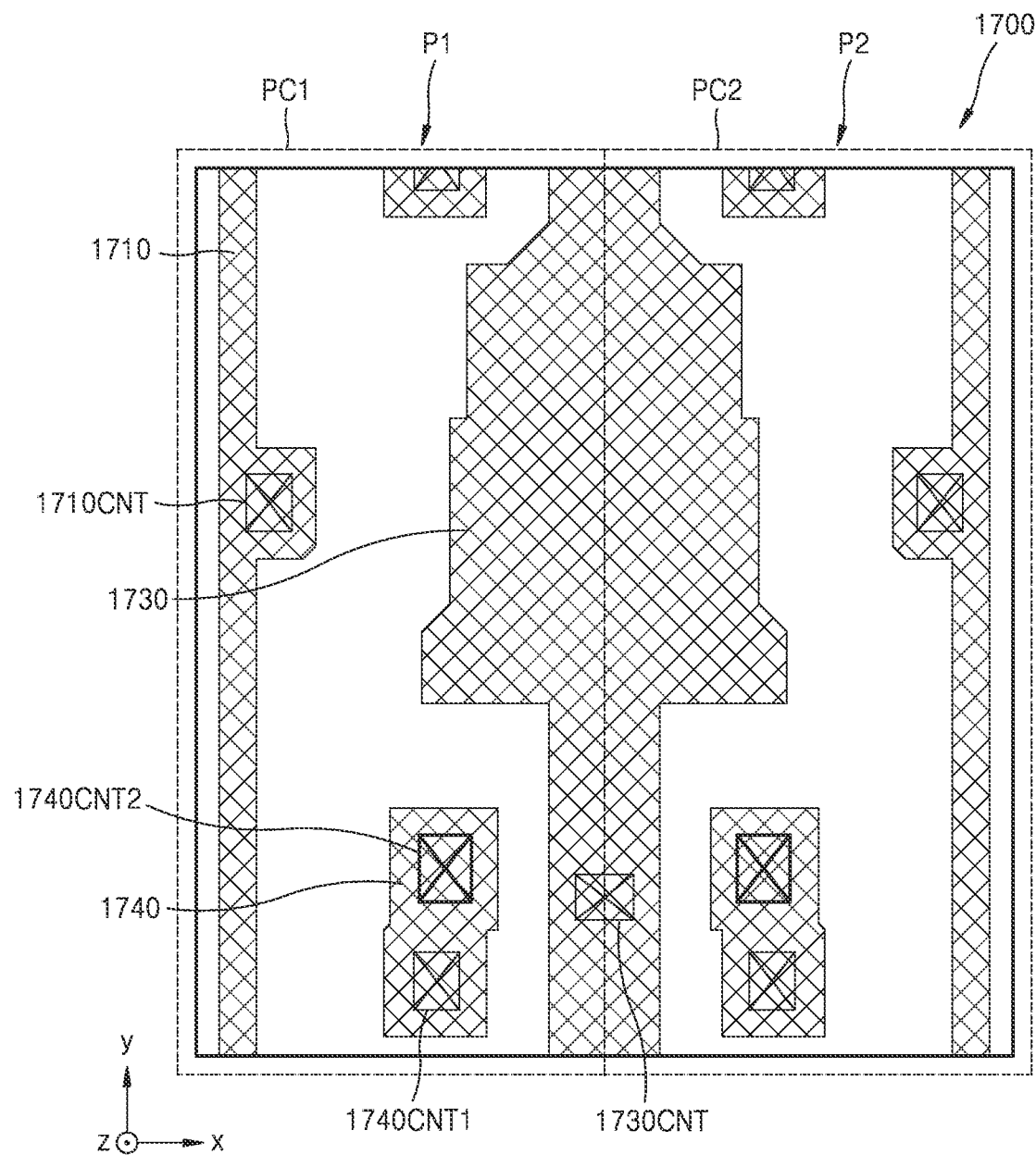
Figure 13:
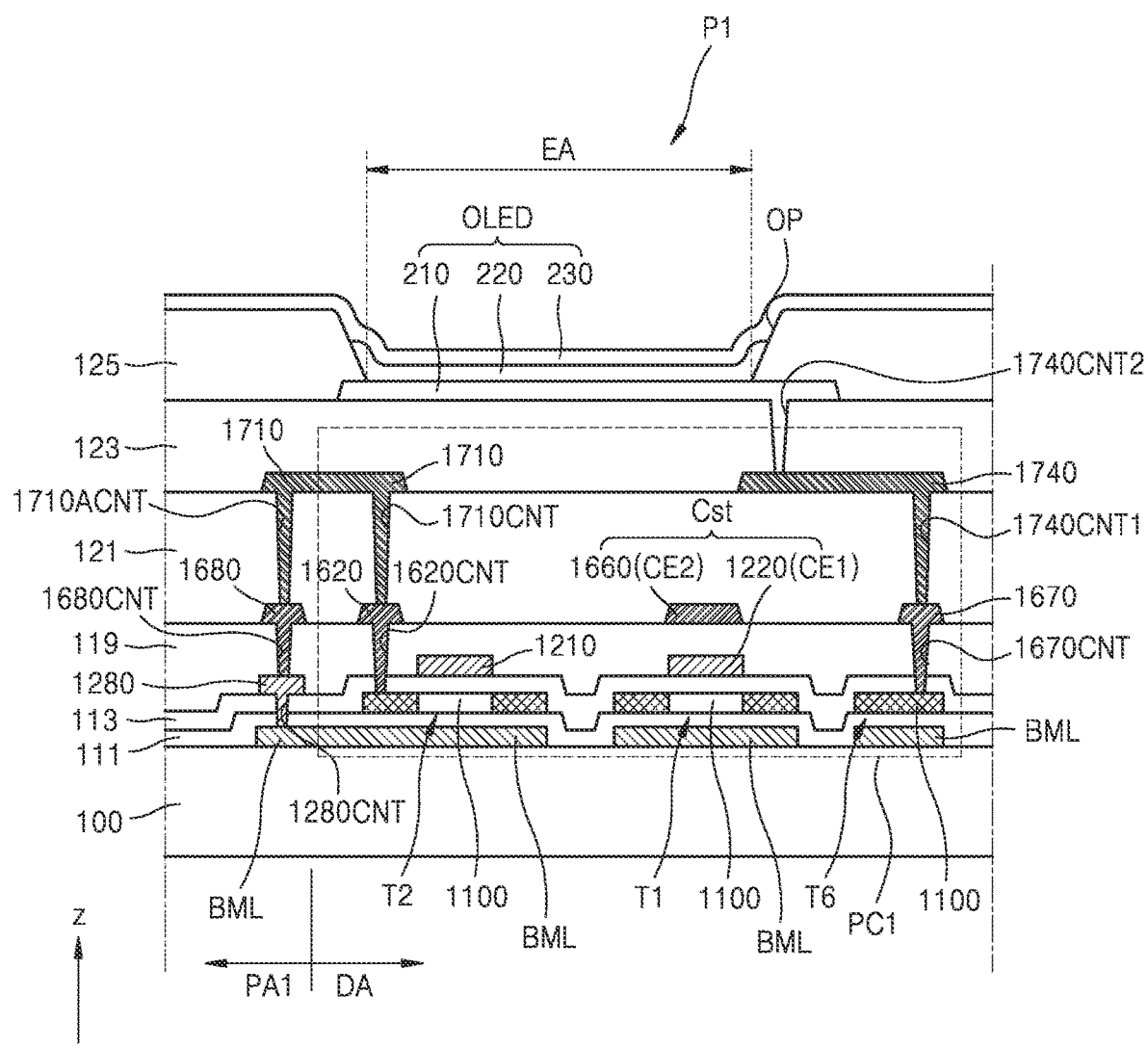
FIG. 13 is a schematic cross-sectional view of a portion of a display apparatus according to embodiments of the present disclosure.

FIG. 7 is a schematic layout diagram illustrating positions of transistors, capacitors, or the like in a pixel included in a display apparatus according to one or more embodiments of the present disclosure. FIGS. 8 to 12 are plan views (e.g., when viewed from a direction normal or perpendicular to an upper surface of the substrate) illustrating components such as the transistors, capacitors, or the like of FIG. 7. FIG. 13 is a schematic cross-sectional view of a portion of a display apparatus according to one or more embodiments of the present disclosure.

As illustrated in the figures, one or more embodiments of the present disclosure may include a first pixel P1 and a second pixel P2 which are adjacent to each other. The first pixel P1 and the second pixel P2 may be symmetrical with respect to a virtual line, as described with reference to FIG. 7. In one embodiment, the first pixel P1 and the second pixel P2 may have the same structure instead of a symmetrical structure. The first pixel P1 may include a first pixel circuit PC1, and the second pixel P2 may include a second pixel circuit PC2. Hereinafter, for convenience of description, some conductive patterns will be described based on the first pixel circuit PC1, but these conductive patterns may also be symmetrical in the second pixel circuit PC2.

Figure 8:
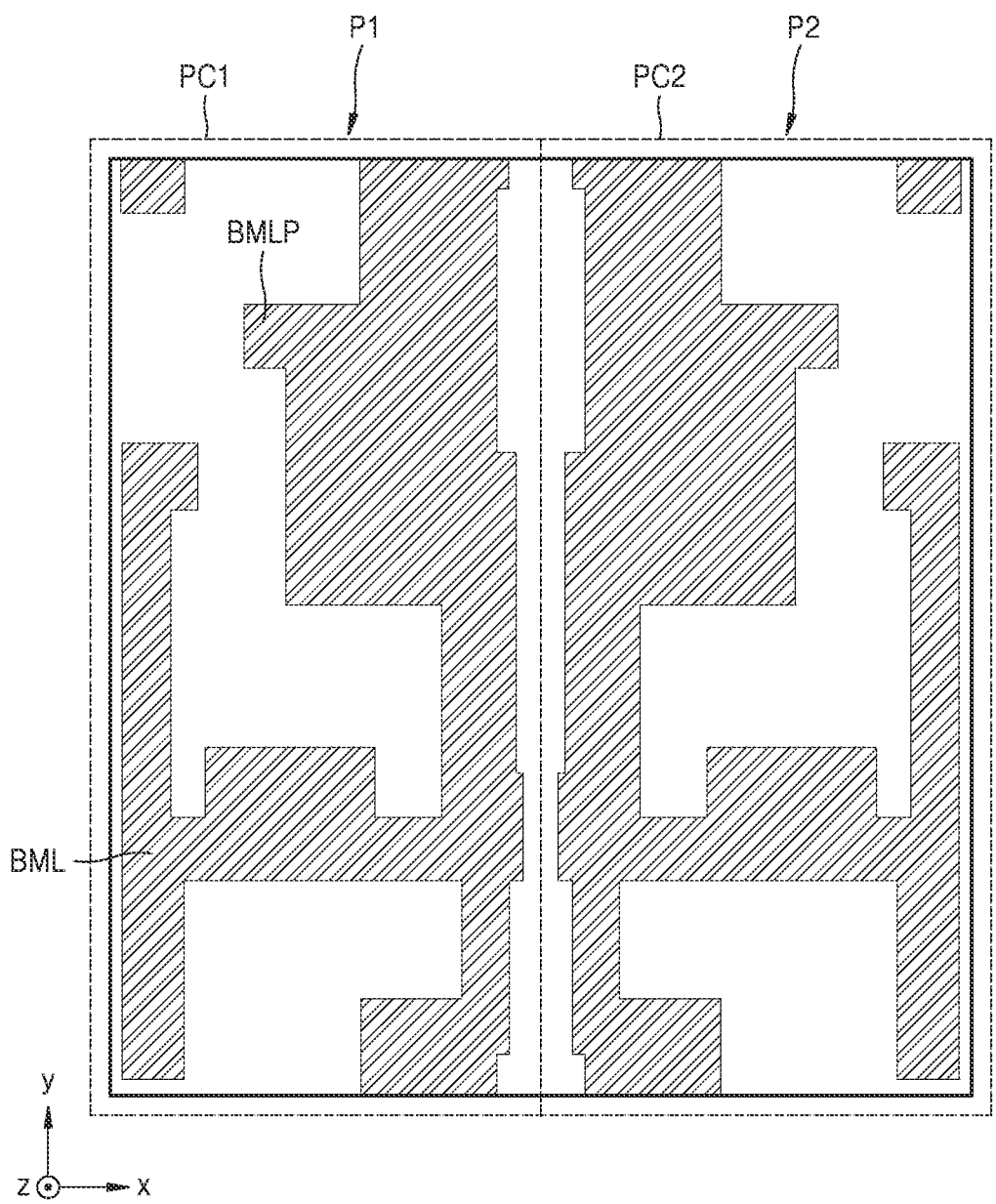
FIGS. 8-12 are plan views illustrating components such as the transistors, capacitors, or the like of FIG. 7.

The bottom metal layer BML as described with reference to FIG. 8 is on the substrate 100, as described with reference to FIG. 13. When necessary, a basic buffer layer including silicon oxide, silicon nitride, or silicon oxynitride may be between the substrate 100 and the bottom metal layer BML. The bottom metal layer BML may include a metal such as silver, copper, aluminum, and/or the like.

The bottom metal layer BML may protect the semiconductor layer 1100. In addition, the bottom metal layer BML may serve as the first extension lines DV1', DV2', and DV3', or the third extension lines DV1, DV2, and DV3 as described with reference to FIG. 5. This is because the bottom metal layer BML may have a shape extending substantially in a second direction (a y-axis direction). That is, the bottom metal layer BML may serve as the first extension lines DV1', DV2', and DV3' in pixels in a portion of the display area DA adjacent to the first peripheral area PA1, and the bottom metal layer BML may serve as the third extension lines DV1, DV2, and DV3 in pixels in a portion of the display area DA adjacent to the second peripheral area PA2. The bottom metal layer BML may not serve as the extension lines in pixels located in the center of the display area DA.

Referring to FIG. 13, the bottom metal layer BML may be covered by a buffer layer 111. The buffer layer 111 may prevent a phenomenon in which metal atoms or impurities diffuse from the substrate 100 or the bottom metal layer BML to the semiconductor layer 1100. The buffer layer 111 may include an inorganic insulating material such as silicon oxide, silicon nitride, silicon oxynitride, aluminum oxide, and/or the like.

Figure 9:
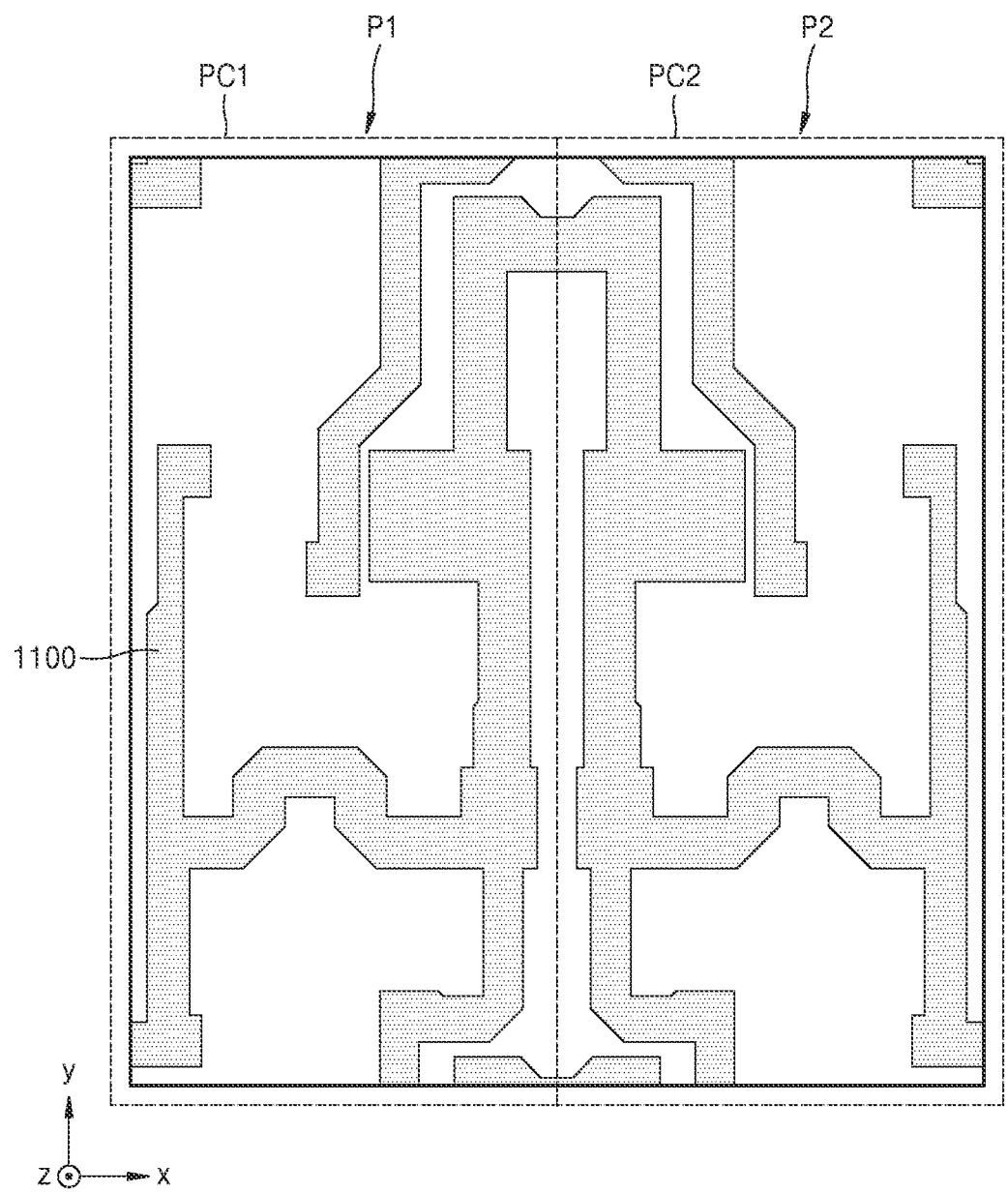

Referring to FIG. 9, the semiconductor layer 1100 may be arranged over the buffer layer 111. The semiconductor layer 1100 may include an oxide semiconductor material. The semiconductor layer 1100 may have a patterned shape. One such possible patterned shape is shown in FIG. 9, but other embodiments may utilize different patterned shapes. The patterned shape of the semiconductor layer 1100 may correspond to positions at which the plurality of thin-film transistors T1 to T7 are arranged.

Referring to FIG. 13, the semiconductor layer 1100 may be covered by a gate insulating film 113. The gate insulating film 113 may include an insulating material. For example, the gate insulating film 113 may include silicon oxide, silicon nitride, silicon oxynitride, aluminum oxide, and/or the like. A gate layer above the semiconductor layer 1100 may be on the gate insulating film 113.

Figure 10:
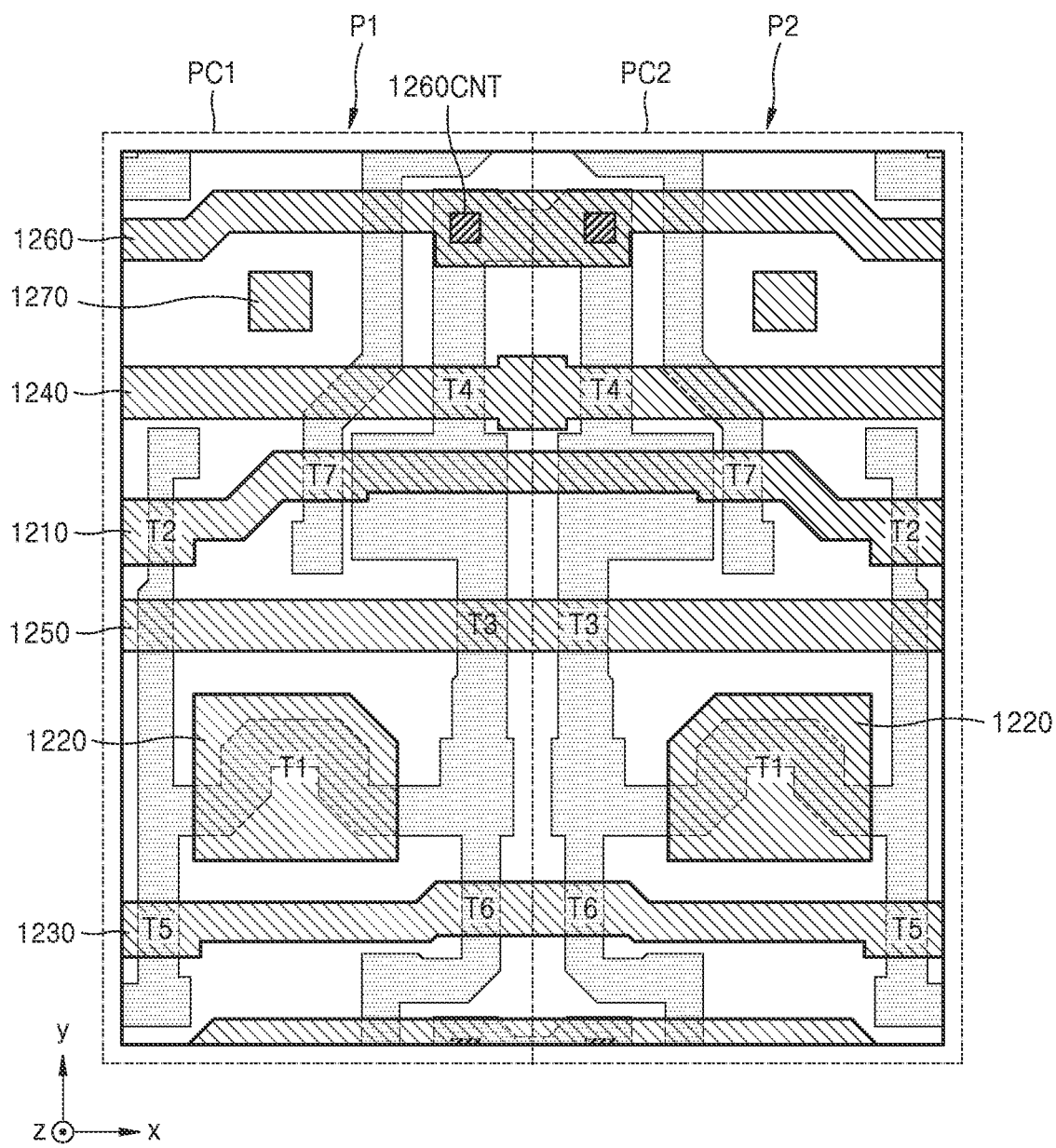

Referring to FIG. 10 the gate layer may include a first scan line 1210, a driving gate electrode 1220, an emission control line 1230, a previous scan line 1240, a second scan line 1250, a first initialization voltage line 1260, and an extension line connection layer 1270. Among them, the first scan line 1210, the emission control line 1230, the previous scan line 1240, the second scan line 1250, and the first initialization voltage line 1260 may have a shape extending substantially in a first direction (an x-axis direction), and may pass by a plurality of pixels. When viewed from a direction perpendicular to the substrate 100, portions of the first scan line 1210, the emission control line 1230, the previous scan line 1240, and the second scan line 1250, which overlap the semiconductor layer 1100, may correspond to the plurality of thin-film transistors T1 to T7. In addition, portions adjacent to portions of the semiconductor layer 1100 respectively corresponding to gate electrodes may be a source area and a drain area of a corresponding thin-film transistor.

For example, a portion of the first scan line 1210 overlapping the semiconductor layer 1100 may be a switching gate electrode of the switching transistor T2. The other portion of the first scan line 1210 overlapping the semiconductor layer 1100 may be a second initialization gate electrode of the second initialization transistor T7. That is, the first scan line 1210 may serve as the first scan line SL1 as described with reference to FIG. 6, and may also serve as the following scan line SLn of FIG. 6. The first scan line 1210 may function as the first scan line SL1 and the following scan line SLn by delivering an electrical signal with a time difference, possibly the same electrical signal.

Portions of the emission control line 1230 overlapping the semiconductor layer 1100 may be gate electrodes of the operation control transistor T5 and the emission control transistor T6. The emission control line 1230 may correspond to the emission control line EL as described with reference to FIG. 6.

A portion of the previous scan line 1240 overlapping the semiconductor layer 1100 may be a first initialization gate electrode of the first initialization transistor T4. The previous scan line 1240 may correspond to the previous scan line SLp as described with reference to FIG. 6.

A portion of the second scan line 1250 overlapping the semiconductor layer 1100 may be a compensation gate electrode of the compensation transistor T3. The second scan line 1250 may correspond to the second scan line SL2 of FIG. 6.

The first initialization voltage line 1260 may connected to the semiconductor layer 1100 therebelow through a contact hole 1260CNT. Accordingly, the first initialization voltage Vint1 may be applied to the first initialization transistor T4. The first initialization voltage line 1260 may correspond to the first initialization voltage line VL1 as described with reference to FIG. 6.

The driving gate electrode 1220, which may be a gate electrode of the driving transistor T1, may be arranged as an island-shape. The driving gate electrode 1220 may serve as the first capacitor electrode CE1 of the storage capacitor Cst.

The gate layer may include a metal, an alloy, a conductive metal oxide, a transparent conductive material, and/or the like. For example, the gate layer may include silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and/or the like.

Referring to FIG. 13, the gate layer may be covered by an interlayer insulating layer 119. The interlayer insulating layer 119 may include an insulating material. For example, the interlayer insulating layer 119 may include silicon oxide, silicon nitride, silicon oxynitride, aluminum oxide, and/or the like.

Figure 11:
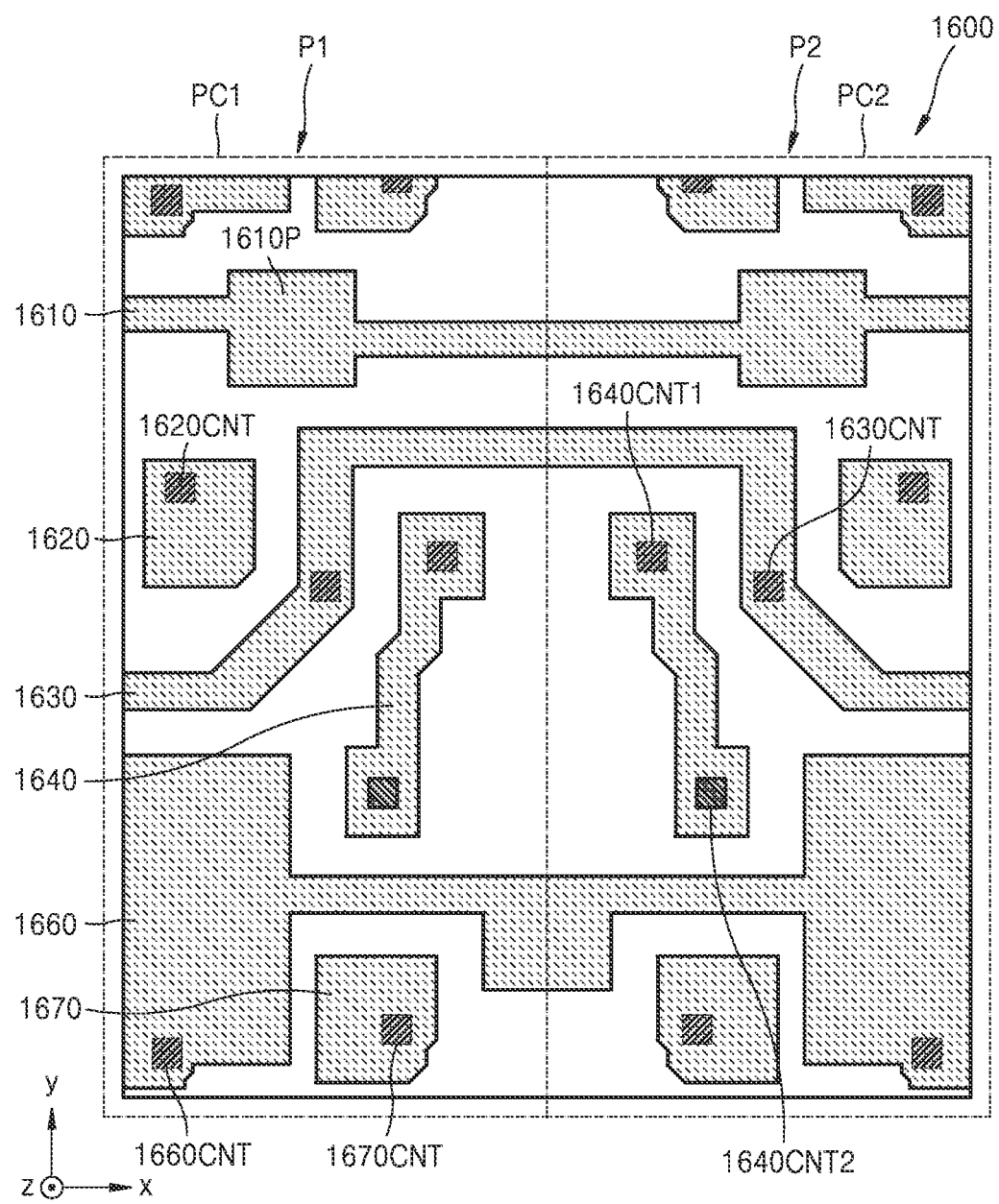

Referring to FIG. 11, a first metal layer 1600 above the interlayer insulating layer 119 includes a second extension line 1610, a first transfer layer 1620, a second initialization voltage line 1630, a second transfer layer 1640, a third transfer layer 1660, and a fourth transfer layer 1670.

The second extension line 1610 may serve as the second extension lines DH1, DH2, and DH3 as described with reference to FIG. 5, as the second extension line 1610 may have a shape extending substantially in a first direction (an x-axis direction). That is, the second extension line 1610 may pass through pixels in portions of the display area DA in contact with the first peripheral area PA1 and the second peripheral area PA2. The second extension line 1610 may not exist in pixels located in the center of the display area DA.

The first transfer layer 1620 may be electrically coupled to the semiconductor layer 1100 therebelow through a contact hole 1620CNT. The first transfer layer 1620 may transfer, to the semiconductor layer 1100, a data signal Dm from an upper data line 1710 (FIG. 12).

The second initialization voltage line 1630 may correspond to the second initialization voltage line VL2 as described with reference to FIG. 6. The second initialization voltage line 1630 has a shape extending substantially in the first direction (the x-axis direction) and may pass through a plurality of pixels. The second initialization voltage line 1630 may be electrically coupled to the semiconductor layer of the second initialization transistor T7 therebelow through a contact hole 1630CNT and may transfer the second initialization voltage Vint2.

One side of the second transfer layer 1640 may be electrically coupled to the semiconductor layer 1100 through a contact hole 1640CNT1, and may be electrically coupled to the semiconductor layers of the compensation transistor T3 and the first initialization transistor T4. Another side of the second transfer layer 1640 may be electrically coupled to the driving gate electrode 1220 through a contact hole 1640CNT2.

The third transfer layer 1660 may extend in the first direction (the x-axis direction) and may pass through the plurality of pixels. The third transfer layer 1660 may be electrically coupled to the semiconductor layer 1100 of the operation control transistor T5 through a contact hole 1660CNT. Accordingly, the third transfer layer 1660 may transfer, to the semiconductor layer 1100 of the operation control transistor T5, the first power voltage ELVDD from a driving voltage line 1730 (FIG. 12). In addition, the third transfer layer 1660 may partially overlap the driving gate electrode 1220, which is a first capacitor electrode, to serve as a second capacitor electrode.

The fourth transfer layer 1670 may be electrically coupled to the semiconductor layer 1100 therebelow through a contact hole 1670CNT, and may be electrically coupled to the semiconductor layer of the emission control transistor T6. The fourth transfer layer 1670 may transfer, to the organic light-emitting diode OLED, a driving current from the emission control transistor T6.

The first metal layer 1600 may include a metal, an alloy, a conductive metal oxide, a transparent conductive material, or the like. For example, the first metal layer 1600 may include Ag, an alloy containing Ag, Mo, an alloy containing Mo, Al, an alloy containing Al, AlN, W, WN, Cu, Ni, Cr, CrN, Tl, Ta, Pt, Sc, ITO, IZO, and/or the like.

Referring to FIG. 13, the first metal layer 1600 may be covered by a first planarization layer 121. The first planarization layer 121 may include an organic insulating material. For example, the first planarization layer 121 may include benzocyclobutene (BCB), polyimide, hexamethyldisiloxane (HDMSO), a general commercial polymer such as poly (methyl methacrylate) (PMMA) or polystyrene (PS), a polymer derivative having a phenol group, an acrylic polymer, an imide polymer, an aryl ether polymer, an amide polymer, a fluorine polymer, a p-xylene polymer, a vinyl alcohol polymer, and/or a mixture thereof. In one or more embodiments, the first metal layer 1600 may be covered by a general insulating layer other than the first planarization layer 121.

A second metal layer 1700, as described in reference to FIG. 12, may be above an insulating layer (or the first planarization layer 121) covering the first metal layer 1600. The second metal layer 1700 may include the data line 1710, the driving voltage line 1730, and a fifth transfer layer 1740.

The data line 1710 may extend in a second direction (a y-axis direction). The data line 1710 may correspond the data line DL as described with reference to FIG. 6. The data line 1710 may be electrically coupled to the first transfer layer 1620 through a contact hole 1710CNT. The data signal Dm may be transferred to the semiconductor layer 1100 through the data line 1710 and the first transfer layer 1620.

The driving voltage line 1730 may extend in the second direction (the y-axis direction). The driving voltage line 1730 may correspond to the driving voltage line PL as described with reference to FIG. 6. The driving voltage line 1730 may provide the first power voltage ELVDD. The driving voltage line 1730 may be electrically coupled, through a contact hole 1730CNT, to the third transfer layer 1660 which may be the second capacitor electrode, such that the first power voltage ELVDD may be transferred to the second capacitor electrode and the operation control transistor T5.

The driving voltage line 1730 may be shared in the first pixel circuit PC1 and the second pixel circuit PC2 which are adjacent to each other, as described with reference to FIG. 12. When necessary, the driving voltage line 1730 may be arranged to each of the first pixel circuit PC1 and the second pixel circuit PC2.

The fifth transfer layer 1740 may be electrically coupled to the fourth transfer layer 1670 therebelow through a contact hole 1740CNT1. In addition, the fifth transfer layer 1740 may be electrically coupled to a pixel electrode 210 (FIG. 13) of the organic light-emitting diode OLED through an upper contact hole 1740CNT2. Accordingly, the driving current may be transferred to the pixel electrode 210.

The second metal layer 1700 may be covered by a second planarization layer 123, as described in reference in FIG. 13. The second planarization layer 123 may include an organic insulating material. For example, the second planarization layer 123 may include BCB, polyimide, HMDSO, a general commercial polymer such as PMMA or PS, a polymer derivative having a phenol group, an acrylic polymer, an imide polymer, an aryl ether polymer, an amide polymer, a fluorine polymer, a p-xylene polymer, a vinyl alcohol polymer, and/or a mixture thereof.

The organic light-emitting diode OLED may be on the second planarization layer 123. The organic light-emitting diode OLED may include the pixel electrode 210 which is a first electrode, an intermediate layer 220 including an emission layer, an opposite electrode 230 which is a second electrode.

The pixel electrode 210 may include a (semi-)transparent electrode or a reflective electrode. The pixel electrode 210 may include a reflective layer including Ag, magnesium (Mg), Al, Pt, gold (Au), Ni, neodymium (Nd), iridium (Ir), Cr, a compound thereof, and/or the like, and a transparent or semi-transparent electrode layer formed on the reflective layer. The transparent or semi-transparent electrode layer may include at least one selected from the group consisting of ITO, IZO, a zinc oxide (ZnO), an indium oxide ($In_2O_3$), an indium gallium oxide (IGO), and an aluminum oxide (AZO). For example, the pixel electrode 210 may have a multi-layered structure of ITO/Ag/ITO.

A pixel defining film 125 may be on the second planarization layer 123. The pixel defining film 125 may prevent an arc or the like from being generated at an edge of the pixel electrode 210 by increasing a distance between the edge of the pixel electrode 210 and the opposite electrode 230 above the pixel electrode 210. The pixel defining film 125 may be formed of one or more organic insulating materials selected from a group including polyimide, polyamide, an acrylic resin, BCB, and/or a phenol resin by a spin coating method or the like.

The intermediate layer 220 of the organic light-emitting diode OLED may be in an opening OP formed by the pixel defining film 125. An emission area EA of the organic light-emitting diode OLED may be defined by the opening OP.

The intermediate layer 220 may include an emission layer. The emission layer may include a fluorescent material or a phosphorescent material emitting red, green, blue, white, or other colored light. The emission layer may include a low-molecular organic material or a polymer organic material, and a functional layer such as a hole transport layer (HTL), a hole injection layer (HIL), an electron transport layer (ETL), an electron injection layer (EIL), or the like may be further be above or below the emission layer. The functional layer may not only in the opening OP, but may be integral formed as a single body throughout the plurality of pixels.

The opposite electrode 230 may be a transparent electrode or a reflective electrode. For example, the opposite electrode 230 may be a transparent or a semi-transparent electrode, and include a metal film having a small work function and including lithium (Li), calcium (Ca), lithium fluoride (LiF), Al, Ag, Mg, and/or a compound thereof. In addition, a transparent conductive oxide (TCO) film such as ITO, IZO, ZnO, $In_2O_3$, or the like above the metal film may be further included. The opposite electrode 230 may be integrally formed over the entire surface of the display area DA and may be on the intermediate layer 220 and the pixel defining film 125.

As described with reference to FIG. 5, the first data line DL1 may be electrically coupled to the first extension line DV1' in the first peripheral area PA1. That is, the data line 1710 as described with reference to FIG. 12 is, after extending to the first peripheral area PA1, may be electrically coupled to the bottom metal layer BML, which serves as the first extension line DV1' as described with reference to FIG. 8 in the first peripheral area PA1. FIG. 13 illustrates that in the first peripheral area PA1, the data line 1710 included in the second metal layer 1700 is electrically coupled to a second outer connection layer 1680 included in the first metal layer 1600 therebelow through an additional contact hole 1710ACNT, the second outer connection layer 1680 is electrically coupled to a first outer connection layer 1280 included in the gate layer therebelow through a contact hole 1680CNT, and the first outer connection layer 1280 is electrically coupled to the bottom metal layer BML therebelow through a contact hole 1280CNT formed in the buffer layer 111 and the gate insulating film 113.

The bottom metal layer BML which may serve as the first extension line DV1' may be, after extending into the display area DA as described above with reference to FIG. 5, electrically coupled to the second extension line 1610 included in the first metal layer 1600. In the pixels shown in FIG. 11, the second extension line 1610 is not electrically coupled to the bottom metal layer BML. However, the display apparatus includes a pixel in which the second extension line 1610 is electrically coupled to the bottom metal layer BML through contact holes defined in that pixel. In the latter case, a part 1610P of the second extension line 1610 may be electrically coupled to the extension line connection layer 1270 included in the gate layer through a contact hole defined in the interlayer insulating layer 119, and the extension line connection layer 1270 may be electrically coupled to a part BMLP of the bottom metal layer BML through a contact hole defined in the buffer layer 111 and the gate insulating film 113. Herein, the bottom metal layer BML may refer to the third extension line DV1 as described with reference to FIG. 5. The third extension line DV1 may extend in an extension direction parallel to an extension direction of the first extension line DV1', as described with reference to FIG. 5.

In a case of a display apparatus according to one or more embodiments, while the semiconductor layer 1100 including an oxide semiconductor material is protected by the bottom metal layer BML, the bottom metal layer BML may also be used as an extension line, allowing the area of the peripheral area PA to be reduced.

As described with reference to FIG. 5, the first input line IL1 may be electrically coupled to the third extension line DV1 included in the bottom metal layer BML. At this time, as described with reference to FIG. 13 or the like, because the bottom metal layer BML is a metal layer closest to the substrate 100, the first input line IL1 may be over the third extension line DV1, as described with reference to FIG. 5. The first input line IL1 may be, for example, on a layer on which the gate layer is, may be on a layer on which the first metal layer 1600 is, or may be on a layer on which the second metal layer 1700 is, if necessary.

In addition, as described with reference to FIG. 5, the second data line DL2 may have a shape extending from the display area DA to the second peripheral area PA2, and may be electrically coupled to the second input line IL2. At this time, the second input line IL2 may be below the second data line DL2, as described with reference to FIG. 5. In such an embodiment, the second input line IL2 may be, for example, on a same layer as the gate layer, or may be on a same layer as the first metal layer 1600. When the second input line IL2 is on a same layer as the second metal layer, the second input line IL2 may be on a same layer as the second data line DL2, and thus the second input line IL2 and the second data line DL2 may be integrally formed as a single body.

The first input line IL1 and the second input line IL2 may be on the same layer. For example, the first input line IL1 and the second input line IL2 may be on a layer on which the gate layer is arranged or disposed or may be on a layer on which the first metal layer is arranged.

Figure 14:
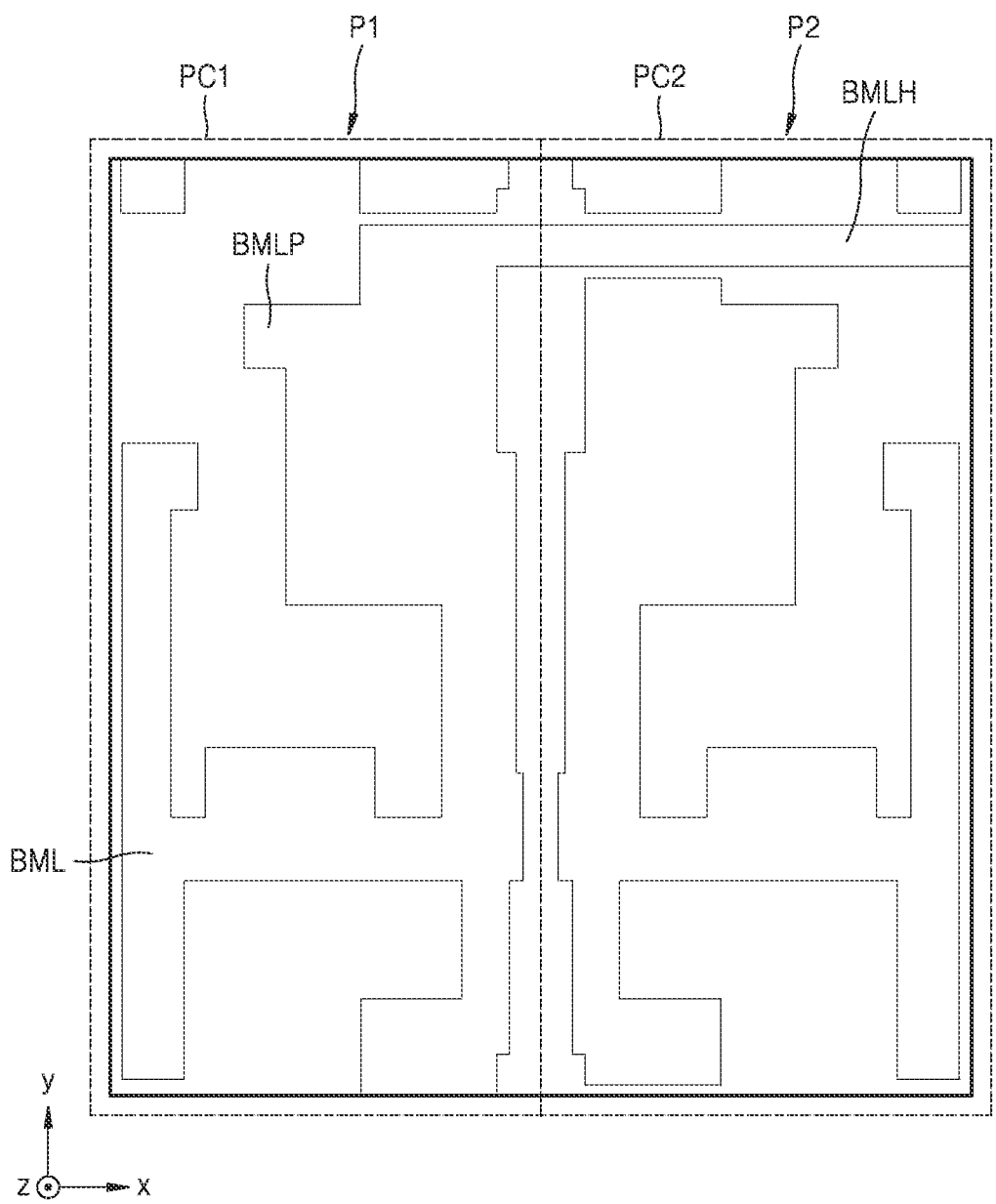
FIG. 14 is a schematic plan view of a layer included in a display apparatus according to embodiments of the present disclosure.

In describing some embodiments, the second extension line 1610 may be described as being located in the first metal layer 1600, but the present disclosure is not limited thereto. For example, referring to FIG. 14, which is a plan view schematically showing one layer included in a display apparatus according to one or more embodiments of the present disclosure, the bottom metal layer BML may include a second extension line BMLH in the display area DA and extending in a first direction (an x-axis direction). That is, the bottom metal layer BML may serve as the second extension line DH1 and the third extension line DV1 while serving as the first extension line DV1' (FIG. 5). FIG. 14 illustrates that the bottom metal layer BML may serve as the first extension line DV1' (FIG. 5) extending substantially in a second direction (a y-axis direction) from the first peripheral area PA1 to the first pixel P1, and may serve as the second extension line DH1 (FIG. 5) in the first direction (the x-axis direction) from the first pixel P1 to the second pixel P2. The bottom metal layer BML in the display area DA near the second peripheral area PA2 may have a shape similar to the bottom metal layer BML in the first pixel P1 to serve as the third extension line DV1 (FIG. 5). As such, the bottom metal layer BML may include the first extension line, the second extension line, and the third extension line. In one or more embodiments, the first extension line, the second extension line, and the third extension line may be integral. In addition, as described with reference to FIG. 5, the first input line IL1 may be electrically coupled to the third extension line through the first contact hole CNT1 while being over the third extension line in the bottom metal layer BML.

For reference, when a display apparatus as shown in FIG. 13 is manufactured, the display apparatus may be manufactured by using a different number of mask operations, for example, a smaller number of mask operations.

First, a first mask operation of forming a metal layer on the substrate 100 and patterning the metal layer to form the bottom metal layer BML as described in reference to FIG. 8 may be performed, and the buffer layer 111 may be formed on the surface of the substrate 100, and, for example, over the entire surface of the substrate. Thereafter, a second mask operation of forming an oxide semiconductor material on the buffer layer 111 and patterning the oxide semiconductor material to form the semiconductor layer 1100 as described in reference to FIG. 9 may be performed, and the gate insulating film 113 may be formed on the entire surface of the substrate 100. Then, a third mask operation of forming a contact hole for the first outer connection layer 1280 in the gate insulating film 113 and the buffer layer 111 may be performed. The contact hole may expose a portion of the bottom metal layer BML therebelow. When forming the contact hole for the first outer connection layer 1280, the contact hole 1260CNT (FIG. 10) may be formed at the same time.

Thereafter, a fourth mask operation of forming a metal layer on the gate insulating film 113 and patterning the metal layer to form the gate layer as described in reference to FIG. 10 may be performed, and the interlayer insulating layer 119 may be formed on the entire surface of the substrate 100. In addition, a fifth mask operation of forming contact holes 1620CNT, 1630CNT, 1640CNT1, 1640CNT2, 1660CNT, 1670CNT, and 1680CNT may be performed, and a sixth mask operation of forming a metal layer on the interlayer insulating layer 119 and patterning the metal layer to form the first metal layer 1600 as described in reference to FIG. 11 may be performed. Then, a seventh mask operation of forming the first planarization layer 121 and forming contact holes 1710ACNT, 1710CNT, 1740CNT1, 1730CNT in the first planarization layer 121 may be performed.

In addition, an eighth mask operation of forming a metal layer on the first planarization layer 121 and patterning the metal layer to form the second metal layer 1700 as described in reference to FIG. 12 is performed. Then, a ninth mask operation of forming the second planarization layer 123 on the surface of the substrate 100, for example, the entire surface of the substrate 100, and then forming the contact hole 1740CNT2 in the second planarization layer 123 may be performed. In addition, a tenth mask operation of forming a conductive layer on the second planarization layer 123 and patterning the conductive layer to form the pixel electrode 210 may be performed. Then, an eleventh mask operation of forming an insulating layer and forming an opening OP in the insulating layer to form the pixel defining film 125 may be performed.

As described above, in the case of the display apparatus according to one or more embodiments, by forming the bottom metal layer BML to have the first extension line, the second extension line, and/or the third extension line, the display apparatus with a reduced area of the peripheral area PA may be manufactured without increasing the number of mask operations to more than 11 times. In one or more embodiments, the display apparatus according to the present disclosure may be manufactured with fewer than 11 mask operations.

According to embodiments of the present disclosure formed as described above, a display apparatus in which an area of a peripheral area is reduced while having a simple structure may be formed. The scope of the present disclosure is not limited by these effects.

It should be understood that embodiments of the present disclosure described herein should be considered in a descriptive sense only and not for purposes of limitation. Descriptions of features or aspects within each embodiment should typically be considered as available for other similar features or aspects in other embodiments. While one or more embodiments of the present disclosure have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
   a substrate;
   a bottom metal layer over the substrate and comprising a first extension line extending from a peripheral area outside a display area into the display area;
   a semiconductor layer over the bottom metal layer;
   a first metal layer over the semiconductor layer; and
   a second metal layer over the first metal layer and comprising a first data line, the first data line extending from the peripheral area into the display area and being electrically coupled to the first extension line in the peripheral area.

2. The display apparatus of claim 1, wherein the first metal layer comprises a second extension line in the display area, the second extension line being electrically coupled to the first extension line and extending in a direction crossing an extension direction of the first extension line.

3. The display apparatus of claim 2, wherein the bottom metal layer further comprises a third extension line extending from the display area to the peripheral area and electrically coupled to the second extension line.

4. The display apparatus of claim 3, wherein the third extension line extends in an extension direction parallel to the extension direction of the first extension line.

5. The display apparatus of claim 3, further comprising:
   a first input line on the third extension line in the peripheral area, the first input line being electrically coupled to the third extension line.

6. The display apparatus of claim 5, further comprising:
   a second input line below the second metal layer in the peripheral area,
   wherein the second metal layer further comprises a second data line extending from the peripheral area into the display area and electrically coupled to the second input line in the peripheral area.

7. The display apparatus of claim 6, further comprising:
   a gate layer over the semiconductor layer,
   wherein the first metal layer is over the gate layer, and the first input line and the second input line are on a layer on which the gate layer is.

8. The display apparatus of claim 6, wherein the first input line and the second input line are on a same layer as the first metal layer.

9. The display apparatus of claim 1 wherein the bottom metal layer overlaps the semiconductor layer in a plan view.

10. The display apparatus of claim 9, wherein the semiconductor layer comprises an oxide semiconductor material.

11. The display apparatus of claim 1, further comprising:
a gate layer over the semiconductor layer,
wherein the first metal layer is over the gate layer, the gate layer comprises a first outer connection layer in the peripheral area, the first outer connection layer is electrically coupled to the first extension line, the first metal layer comprises a second outer connection layer in the peripheral area, the second outer connection layer is electrically coupled to the first outer connection layer, and the first data line is electrically coupled to the second outer connection layer in the peripheral area.

12. The display apparatus of claim 11, wherein the semiconductor layer comprises a switching semiconductor layer for a switching transistor in the display area,
the first metal layer further comprises a first transfer layer in the display area, and
the first data line is electrically coupled to the switching semiconductor layer through the first transfer layer.

13. The display apparatus of claim 12, wherein the gate layer further comprises a switching gate electrode on the switching semiconductor layer.

14. The display apparatus of claim 1, further comprising:
a gate layer over the semiconductor layer, wherein the first metal layer is over the gate layer; and
an insulating layer between corresponding two layers selected from the bottom metal layer, the semiconductor layer, the gate layer, the first metal layer, and the second metal layer.

15. The display apparatus of claim 1, further comprising:
a pixel electrode on the second metal layer;
an intermediate layer on the pixel electrode and comprising an emission layer; and
an opposite electrode on the intermediate layer.

16. The display apparatus of claim 1, wherein the bottom metal layer further comprises a second extension line in the display area, the second extension line being connected to the first extension line and extending in a direction crossing an extension direction of the first extension line.

17. The display apparatus of claim 16, wherein the bottom metal layer further comprises a third extension line, the third extension line extending from the display area to the peripheral area and electrically coupled to the second extension line.

18. The display apparatus of claim 17, wherein the third extension line extends in an extension direction parallel to the extension direction of the first extension line.

19. The display apparatus of claim 17, further comprising:
a first input line on the third extension line in the peripheral area, the first input line being electrically coupled to the third extension line.

* * * * *